United States Patent
Takahara et al.

[11] Patent Number: 5,861,672
[45] Date of Patent: Jan. 19, 1999

[54] NONLINEAR RESISTANCE ELEMENT, MANUFACTURING FABRICATION METHOD THEREOF, AND LIQUID CRYSTAL DISPLAY DEVICE

[75] Inventors: Kenichi Takahara; Takashi Inami; Takashi Inoue, all of Suwa, Japan

[73] Assignee: Seiko Epson Corporation, Tokyo, Japan

[21] Appl. No.: 313,248

[22] PCT Filed: Feb. 10, 1994

[86] PCT No.: PCT/JP94/00204

§ 371 Date: Oct. 4, 1994

§ 102(e) Date: Oct. 4, 1994

[87] PCT Pub. No.: WO94/18600

PCT Pub. Date: Aug. 18, 1994

[30] Foreign Application Priority Data

Feb. 10, 1993 [JP] Japan ................................. 5-22837
Feb. 10, 1993 [JP] Japan ................................. 5-22839
Mar. 2, 1993 [JP] Japan ................................. 5-41449
May 7, 1993 [JP] Japan ............................... 5-106930

[51] Int. Cl.[6] .......................... H01L 23/48; H01L 23/52; H01L 29/40
[52] U.S. Cl. ....................... 257/758; 257/761; 257/764
[58] Field of Search .................... 257/761, 764, 257/758

[56] References Cited

U.S. PATENT DOCUMENTS 4,975,168 12/1990 Ohno et al. ..................... 204/192.13
4,975,760 12/1990 Dohjo et al. ............................ 257/59
5,264,728 11/1993 Ikeda et al. ........................... 257/761
5,349,205 9/1994 Kobayahsi et al. ..................... 257/59
5,431,773 7/1995 Ikeda et al. ............................ 216/23

FOREIGN PATENT DOCUMENTS 57-122476 7/1982 Japan.
A-1-230023 9/1989 Japan.
A-1-300226 12/1989 Japan.
3-45932 2/1991 Japan ..................................... 359/87
A-3-293329 12/1991 Japan.
4-340930 11/1992 Japan ..................................... 359/54

OTHER PUBLICATIONS

Katsumi AOTA, "Full–Color LCD Using MIM Diodes with Two–Mask Process" *SID 91 Digest*, pp. 219–222, 1991.

*Primary Examiner*—Mahshid D. Saadat
*Assistant Examiner*—Allan R. Wilson
*Attorney, Agent, or Firm*—Oliff & Berridge, PLC

[57] ABSTRACT

A nonlinear resistance element of this invention comprises a first conductive layer, an insulating layer, and a second conductive layer stacked in sequence on a substrate, wherein: the first conductive layer is a metal film whose main component is a metal to which is added a chemical element having a valence 1 or 2 greater than that of the main component metal, in a concentration of 0.2% to 6 atom %, and the insulating layer is an anodized layer of the first conductive layer. This nonlinear resistance element is particularly suitable for use as a switching element for an active matrix type of liquid crystal display device.

37 Claims, 32 Drawing Sheets

$O_2 / Ar : 4 \times 10^{-4}$

100nm $O_2 / Ar : 5 \times 10^{-3}$

100nm $O_2 / Ar : 1 \times 10^{-2}$

100nm $O_2 / Ar : 4 \times 10^{-2}$

100nm

NONLINEAR RESISTANCE ELEMENT, MANUFACTURING FABRICATION METHOD THEREOF, AND LIQUID CRYSTAL DISPLAY DEVICE

FIELD OF THE INVENTION

The present invention relates to a nonlinear resistance element (in particular, to an MIM element) that is suitable for use as a pixel-switching element of a liquid crystal display device of a laptop computer, engineering workstation (EWS), or liquid crystal TV, and a method of manufacturing such a nonlinear resistance element.

BACKGROUND ART

Recently, there have been many attempts to replace the prior art CRTs used in laptop computers, EWSs, mini-TVs and the like with liquid crystal display devices, to reduce the dimensions, weight, and power consumptions of such equipment.

Various types of element are used as pixel-switching elements in these liquid crystal display devices, such as a three-terminal thin film transistor (TFT) using polysilicon or amorphous silicon, or a two-terminal nonlinear resistance element of a metal-insulator-metal (MIM) structure. Since the manufacture of TFT and other similar three-terminal elements necessitates the repeated formation of thin films on the structure, these manufacturing processes are complicated and, for reasons such as the presence of intersections between signal lines on the substrate, element defects can easily occur, causing the problem of deteriorated yield. In contrast, a two-terminal element such as an MIM element has a simpler manufacturing process than a three-terminal element, so that yield is increased, and, since there are no intersections between signal lines, it is attracting attention because it can be made less expensively with a larger area, and so it is currently being improved on and developed.

An MIM element has a structure of two electrically conductive thin films sandwiching an insulator thin film, and the voltage-current characteristic between the electrically conductive thin films is nonlinear. A typical MIM element has a tantalum(Ta)—tantalum oxide($Ta_2O_5$)—chromium (Cr) structure and is usually manufactured by the method described below. First, after a thin Ta film has been formed by sputtering on a glass substrate, it is etched to leave timing signal lines and MIM element portions. Next, a $Ta_2O_5$ insulating layer is formed on the surface of the thin Ta film by an anodization method. Anodization is a favorable method in forming an insulating layer that is finer than sputtering or chemical vapor deposition (CVD), with few pinholes. Next, a Cr thin film is formed by sputtering and is then patterned, and then an electrode pattern for driving the liquid crystal is formed of a transparent conductive film of indium tin oxide (ITO).

In order to achieve a high level of image quality in a liquid crystal panel that uses this type of MIM element, it is generally important to ensure that the following characteristics are satisfied:

(1) the capacity of the element must be sufficiently less than that of the liquid crystal,
(2) the voltage-current characteristic of the element must have a large degree of nonlinearity, such that the ratio of the ON current to the OFF current is sufficiently large, and
(3) a positive voltage side and a negative voltage side of the voltage-current characteristic of the element must be symmetrical.

One technique used to simplify the manufacturing process is disclosed in, for example, Japanese Patent Application Laid-Open No. 57-122476. In this technique, a transparent conductive film formed of ITO is used as an upper electrode. Forming the upper electrode of a transparent conductive film in this manner ensures that the upper electrode can be formed at the same time as a transparent electrode layer of a pixel electrode, thus the steps of forming and etching the upper electrode film can be omitted, enabling a further decrease in the number of steps. However, the positive voltage side and negative voltage side of the voltage-current characteristic of an MIM element that has an upper electrode formed of ITO differ greatly, and thus it is difficult to obtain a good current characteristic. This asymmetry of the voltage-current characteristic due to positive and negative applied voltages is a cause of flicker in the screen of the liquid crystal display device and also deterioration of the liquid crystal material.

Various techniques have been proposed in order to adapt an MIM element that uses an ITO upper electrode to a liquid crystal display device, such as a back-to-back structure in which MIM elements are connected in series but facing in opposite directions, so that a symmetrical current characteristic with respect to positive and negative applied voltages is obtained, or controlling the driving method such that the magnitudes of voltages applied from the outside and the waveforms themselves are adjusted asymmetrically to match polarity differences (Katsumi Aota, et al., SID 91 DIGEST, p. 219, 1991). However, the former technique markedly increases the cost of the manufacturing process of the MIM element, and the latter tends to increase costs because of increasing the number of external power supplies and getting larger in size of the driver IC.

The present inventors have confirmed that there is another problem with the prior art in that current injection causes the voltage-current characteristic of the element to change with time. If the liquid crystal display device is driven by an active matrix method, for example, this change with time of the voltage-current characteristic manifests itself as afterimages or unevenness in the display.

An objective of this invention is, in addition to satisfy the above mentioned general characteristics required of an MIM element, to provide a nonlinear resistance element that is able to suppress changes with time of the voltage-current characteristic due to heat or current injection, and is suitable for use as a switching element, as well as a method of manufacturing such a nonlinear resistance element.

Another objective of this invention is to provide a liquid crystal display device configured using the above nonlinear resistance element, which is capable of maintaining a good image quality in the long term.

SUMMARY OF THE INVENTION

A nonlinear resistance element of this invention as specified in claim 1 is a nonlinear resistance element (MIM element) comprising a first conductive layer, an insulating layer, and a second conductive layer stacked in sequence on a substrate, wherein: the first conductive layer is a metal film whose main component is a metal to which is added a chemical element having a valence 1 or 2 greater than that of the main metal, in the concentration of 0.2 to 6 atom %; and the insulating layer is an anodized layer of the first conductive layer.

In this nonlinear resistance element, a metal such as tantalum or aluminum could be used as the main metal, but tantalum in particular is preferable. Further, at least one selected from the group of tungsten, chromium, molybdenum, and rhenium could be used as the chemical element added to the first conductive layer, in particular, tungsten is preferable. The tungsten could be added in the form of a compound such as tungsten oxide ($WO_3$). Further, it could be used as the material forming the second conductive layer such as chromium, molybdenum, titanium, or aluminum, or a transparent conductive film, preferably chromium or a transparent conductive film, and particularly, a transparent conductive film of ITO is preferable.

Next, the results of experiments performed to determine whether the chemical element added to the first conductive layer has any effect on the current characteristic of the nonlinear resistance element of this invention will be discussed below. More specifically, these experiments were designed to investigate how the current flowing through the MIM element is affected by changes in the tungsten concentration, when tantalum is used as the metal of the first conductive layer and tungsten is used as the added chemical element. The current characteristic of an element in which chromium was used as the second conductive layer is shown in FIG. 1, and the current characteristic of an element in which ITO was used as the second conductive layer is shown in FIG. 2.

SAMPLES

The elements used as samples in these experiments were configured as described below.

First, a thin film of either tantalum alone or tantalum with added tungsten was deposited to a film thickness of approximately 3500 angstrom by sputtering on a glass substrate, to form the first conductive layer. The element was then anodized using a constant-voltage process set to 30 V in a 0.01% by weight aqueous solution of citric acid for 2 hours, to form the insulating layer to a thickness of approximately 530 angstrom. Next, the element was annealed in a nitrogen atmosphere at a temperature of 400° C. for approximately 1 hour. After that, chromium or ITO was deposited on the insulating layer by sputtering to form the second conductive layer. In this case, the thickness of the second conductive layer was 1,500 angstrom for chromium or 1000 angstrom for ITO. The element was again annealed in a nitrogen atmosphere at a temperature of 250° C. for 1 hour. Different types of element with various different tungsten concentrations were prepared as samples. The dimensions of these samples were 4 μm×4 μm. All the samples used in the experiments described below were obtained by the above method.

The currents flowing through these samples when a voltage of 4 V was applied to them and when a voltage of 15 V was applied to them were investigated. In a liquid crystal display device that uses MIM elements, the voltages applied to an MIM element are 10 to 20 V when the element is selected, and 2 to 6 V when it is not selected. That is why this invention specifies that voltages at substantially the centers of these ranges are selected, so that the ON voltage is 15 V and the OFF voltage is 4 V, and the currents flowing at such times are designated the ON current and OFF current, respectively.

In each of FIGS. 1 and 2, the curve denoted by A shows the results when a voltage of 4 V was applied, and the curve denoted by B shows the results when a voltage of 15 V was applied. In each graph, tungsten concentration is plotted linearly along the X-axis and current density (in $A/cm^2$) is plotted logarithmically along the Y-axis. The curves A1 and B1 drawn with solid lines show the results when a positive bias voltage was applied to the first conductive layer, and the curves A2 and B2 drawn with broken lines show the results when a negative bias voltage was applied to the first conductive layer.

From FIG. 1, it is clear that both the ON current and the OFF current drop with the addition of tungsten, within a specific concentration range, and this drop is particularly marked when the tungsten concentration is low. The tungsten concentration range that reduces these currents depends on the applied voltage, that is with an applied voltage of 4 V it is approximately 3 atom % or less and with an applied voltage of 15 V it is approximately 3 atom % or less. A particular area to note is the drop in the OFF current. Lowering the OFF current increases the contrast ratio of the liquid crystal display image, since it becomes difficult for the charge to escape during the nonselection period. Further, it is also clear from FIG. 1 that, when the tungsten concentration exceeds approximately 0.2 atom %, the tungsten concentration-current density in FIG. 1 for positive and negative voltage polarities are substantially exactly the same, so the symmetry of the current characteristics is extremely good.

From FIG. 2 it is clear that both the ON current and the OFF current drop with the addition of tungsten in a similar manner within a specific concentration range when ITO is used as the second conductive layer. Further, in comparison with an element when tantalum without any added tungsten is used as the first conductive layer and chromium is used as the second conductive layer, it can be seen that the current density of the ON current drops at approximately 4 atom % or less, and that of the OFF current drops at approximately 4.5 atom % or less, and, in particular, it is clear that the reduction effect is particularly large at low concentrations of 2 atom % or less. However, it should be noted that, when ITO is used as the second conductive layer, a greater difference in current densities can be seen at low tungsten concentrations between when a positive bias voltage is applied and when a negative bias voltage is applied, in comparison with when chromium is used, and thus it is clear that the symmetry of voltage polarity is slightly inferior. This symmetry is particularly bad for the OFF current when the tungsten concentration is less than approximately 0.5 atom %.

From the above it can be seen that anodizing a thin film of tantalum to which tungsten has been added causes the OFF current to drop in the thus-formed insulating layer, in comparison with an element in which tungsten is not included. Further, this reduction effect can be seen to be at a maximum when approximately 3 atom % of tungsten is added and chrome is used as the second conductive layer, and at a maximum when approximately 4.5 atom % of tungsten is added and ITO is used as the second conductive layer. Since this reduction in the OFF current increases the contrast of the liquid crystal display image, it helps to improve the image quality.

The nonlinear resistance element specified in claim 8 is a nonlinear resistance element (MIM element) comprising a first conductive layer, an insulating layer, and a second conductive layer stacked in sequence on a substrate, wherein the first conductive layer is preferably a metal film whose main component is tantalum to which is added tungsten, the insulating layer is an anodized layer of the first conductive layer, the second conductive layer is at least one of a chrome film and a transparent conductive film, and the current density (J) of the current flowing through the element can be approximated by Equation 1 below, provided the activation energy (Ea) in Equation 1 is no more than 0.534 eV:

$$J = A \exp(-Ea/kT) \qquad \text{Equation 1}$$

where:

A is a constant, k is Boltzmann's constant, and

T is absolute temperature.

An MIM element is usually sensitive to temperature changes, to such a degree that factors such as heating due to backlighting of a liquid crystal display device or use in a hot location could cause the characteristics to change, leading to a drop in contrast of the display image. This is because, as can be seen from Equation 1, the value of the current in the element is dependent on temperature. Further, current density is a function of activation energy (Ea), and this activation energy becomes more dependent on temperature as the activation energy increases, but less dependent on temperature as the activation energy decreases. If the current-voltage characteristics of MIM elements are measured at different measured temperatures, and current is plotted against 1/T for any desired voltage, the graph will be a substantially straight line and the activation energy (Ea) can be obtained from the slope of this straight line.

Research performed by the present inventors has confirmed that, within a practicable temperature range from room temperature (approximately 22° C.) to 80° C., if the amount of change of the current density (J), in particular that for the OFF current, is within 1.5 orders of magnitude, the above problem with the display characteristics of the liquid crystal display device does not occur, but if the amount of change exceeds 1.5 orders of magnitude, the display characteristics, in particular, the contrast, are likely to deteriorate.

Further, the present inventors have discovered that, if an insulating layer is obtained by anodizing a first conductive layer that is formed of tantalum with added tungsten, the activation energy drops appreciably in comparison with a first conductive layer to which no tungsten is added. They performed experiments to investigate the relationship between activation energy and tungsten concentration which is added to tantalum, using samples obtained by the same method as that described above. The results are shown in FIG. 3 and FIG. 4. FIG. 3 shows the relationship between activation energy and tungsten concentration when chromium is used as the second conductive layer and FIG. 4 shows that when ITO is used as the second conductive layer. In each of FIG. 3 and FIG. 4, $E_4$ shows the values obtained when a voltage of 4 V (OFF voltage) was applied and $E_{15}$ shows the values obtained when a voltage of 15 V (ON voltage) was applied.

From FIG. 3 and FIG. 4, it is clear that the activation energy decreases as the applied voltage increases, and the curve at each voltage has a single peak at the end at which the tungsten concentration is low, whereafter the activation energy gradually decreases. To ensure an activation energy of no more than 0.534 eV for both cases of the ON voltage (15 V) and the OFF voltage (4 V), it is necessary to make the tungsten concentration at least approximately 0.8 atom % when chromium is used as the second conductive layer, and at least approximately 1.2 atom % when ITO is used.

By controlling the tungsten concentration in this manner to keep the activation energy (Ea) of Equation 1 to no more than 0.534 eV, the amount of change in the OFF current that most affects the display characteristics can be held to be within approximately 1.5 orders of magnitude, within the temperature range in which the liquid crystal display device is used in practice. Therefore it is possible to suppress any deterioration in contrast in a liquid crystal display device that uses this element, within a practicable temperature range.

The nonlinear resistance element specified in claim 12 is a nonlinear resistance element (MIM element) comprising a first conductive layer, an insulating layer, and a second conductive layer stacked in sequence on a substrate, wherein the first conductive layer is preferably a metal film whose main component is tantalum to which is added tungsten, the insulating layer is an anodized layer of the first conductive layer, the second conductive layer is at least one of a chromium film and a transparent conductive film, and, if the current density in the element is assumed to be $J_2$ when a bias voltage of 10 V is applied after a current is injected for 10 seconds at a current density of 1 A/cm², and $J_1$ when a bias voltage of 10 V is applied after no current is injected, the following Equation 2 is approximately satisfied, provided the constants B and n in Equation 2 satisfy the relationships $|B| \leq 0.2$ and $n \leq 0$:

$$\log (J_2/J_1) = B \times t^{1/n} \qquad \text{Equation 2}$$

where:

t is the elapsed time (in seconds) since the bias voltage was applied.

Research performed by the present inventors has shown that, by ensuring that Equation 2 is approximately satisfied under the above conditions, and by making sure that the absolute value of the constant B in Equation 2 is no more than 0.2 and that of n is 0 or less, the difference in luminance between a pixel that has changed from displaying white to grey and changed from displaying black to grey can be reduced to a level such that this difference in luminance cannot be perceived by human vision as after-images, or it causes no practical problems. Further, they have confirmed that, in case of a moving display that changes rapidly such as within a few microseconds to a few milliseconds, if the absolute value of the constant B is no more than 0.1, the difference in luminance cannot be perceived as after-images.

One big problem that occurs with a liquid crystal display device that uses prior art MIM elements is the way in which there is a difference in luminance between a pixel that has changed from displaying white to grey and a pixel that has changed from displaying black to grey, and this difference in luminance can be perceived as after-images on the screen. This phenomenon is due to the fact that the current flowing through the MIM element when a pixel has changed from displaying white to grey is different from that when a pixel has changed from displaying black to grey. This difference in currents is thought to be attributable to an injection of current into the insulating layer for, for example, a few microseconds to a few milliseconds, causing a charge to be injected into a trap in the insulating layer, and changing the current-voltage characteristic.

The results of experiments performed to investigate this phenomenon will now be described.

FIG. 5 shows the relationship between current density and time when a bias voltage of 10 V is applied continuously after a current has been injected at 1 A/cm² for 10 seconds (shown at b), and the relationship between current density and time when a bias voltage of 10 V is applied continuously after no current has been injected (shown at a). From FIG. 5, it is clear that there is a difference in current flowing through the element when current injection was performed and when it was not performed, and this difference is particularly obvious in the initial stages of the voltage application, helping the formation of the above described after-images.

The difference between the two current densities (log $(J_2/J_1)$) of FIG. 5 is plotted against time in FIG. 6. From FIG. 6, it is clear that the difference between the current density when current injection was performed (log $J_2$) and the current density when current injection was not performed (log $J_1$) decreases with time. This relationship has been confirmed to hold not only in MIM elements in which tantalum is used as the first conductive layer and chromium is used as the second conductive layer, but also in MIM elements in which ITO is used as the second conductive layer and those in which tantalum with the addition of tungsten is used as the first conductive layer.

Taking the logarithm of Equation 2 gives the following two equations:
when $J_2 > J_1$:

$$\log \{\log (J_2/J_1)\} = \log B + 1/n \log t \quad \text{Equation 5}$$

when $J_1 > J_2$:

$$\log \{-\log (J_2/J_1)\} = \log (-B) + 1/n \log t \quad \text{Equation 6}$$

Various samples in which the relationship $J_1 > J_2$ is satisfied are plotted in FIG. 7, on the basis of Equation 6. In FIG. 7, log t (seconds) is plotted along the X-axis and log{−log $(J_2/J_1)$} is plotted along the Y-axis, so that the intercept on the Y-axis gives log (−B) and the slope of the straight line gives 1/n. FIG. 7 shows examples in which the first conductive layer and the second conductive layer are tantalum and chromium (curve a), tantalum and ITO (curve b), and tantalum with 0.4 atom % of tungsten and ITO (curve c). The values of B and n for the various samples are shown in FIG. 7.

Next, graphs similar to those of FIG. 7 were created to investigate the relationship between the constant B of Equation 2 and the tungsten concentration. These results are shown in FIG. 8 and FIG. 9. In FIG. 8 and FIG. 9, tungsten concentration (atom %) is plotted along the X-axis and the constant B along the Y-axis. FIG. 8 shows results obtained when chromium was used as the second conductive layer and FIG. 9 shows those when ITO was used as the second conductive layer.

From FIG. 8, it can be seen that, in order to keep the absolute value of the constant B in Equation 2 no more than 0.2 when the second conductive layer is chromium, the tungsten concentration could be at least 0.2 atom %, and is more preferably at least 0.3 atom %. Similarly, from FIG. 9, it can be seen that, when the second conductive layer is ITO, it is necessary to make the tungsten concentration at least 0.3 atom %, and more preferably at least 0.6 atom %. In other words, setting the tungsten concentration of the first conductive layer to within the above described range ensures that the absolute value of the constant B in Equation 2 is no more than 0.2, preferably no more than 0.1, with the result that no after-images that would appear as visual defects on the liquid crystal display device occur.

The nonlinear resistance element specified in claim 16 is a nonlinear resistance element (MIM element) comprising a first conductive layer, an insulating layer, and a second conductive layer stacked in sequence on a substrate, wherein: the first conductive layer is preferably a metal film whose main component is tantalum to which is added tungsten, the insulating layer is an anodized layer of the first conductive layer, the second conductive layer is at least one of a chromium film and a transparent conductive film, and the following Equation 3 is approximately satisfied when a voltage within a predetermined range is applied to the element, provided the coefficient S in Equation 3 is no more than $3.1 \times 10^{-3}$:

$$\log (J/J_0) = S \times t^{1/m} \quad \text{Equation 3}$$

where:
t is the elapsed time (in seconds) since the drive was started,

J is the current density (A/cm$^2$) at elapsed time t,
$J_0$ is the current density (A/cm$^2$) when the elapsed time t is 1 second, and
$m \geq 1$, preferably m=5.

Research performed by the present inventors has confirmed that, when Equation 3 is approximately satisfied for the MIM element and the coefficient S of Equation 3 is no more than $3.1 \times 10^{-3}$, the difference in characteristics (log $(J/J_0)$) is no more than approximately 0.1, even when the element is driven for a long time, so that the display characteristics can be maintained over at least 10,000 hours with a standard type of drive method such as an active matrix drive method. More specifically, reducing the difference in characteristics to no more than approximately 0.1 can prevent the problem of after-images (sticking images) that can occur when an image is frozen on screen for a long time, such as for several tens of minutes. This sticking image occurs because, since the current-voltage characteristic of a selected MIM element is changed by continuous driving, if such an element then attempts to display any gradation, the current flowing through the element when a pixel was selected would differ from that when a pixel was not selected, will cause the voltages applied to these two pixels to be different and, as a result, a difference in luminance will occur.

Next, results of investigations into the introduction of Equation 3, as well as relationships between the coefficients of Equation 3 and the tungsten concentration, will be discussed. The relationship between difference in current density and time is shown in FIG. 10, with log t plotted along the X-axis and log $(J/J_0)$ plotted along the Y-axis. In this figure, curve a shows the results of measurements on elements in which the first conductive layer was tantalum and chromium was used as the second conductive layer, and curve b shows the results in which first conductive layer was tantalum with the addition of 0.7 atom % tungsten and chromium was used as the second conductive layer. FIG. 11 investigates the curves a and b of FIG. 10, replotting them with $t^{1/5}$ along the X-axis and log $(J/J_0)$ along the Y-axis. From FIG. 11, it was confirmed that $t^{1/5}$ and log $(J/J_0)$ are in a substantially completely straight line relationship, and Equation 3 is satisfied. Further, it has been confirmed that adding tungsten to the first conductive layer markedly reduces difference in current density with time (log $(J/J_0)$), such that this difference in current characteristics becomes extremely small.

The predetermined range of voltages that is a precondition of Equation 3 means the voltage range in which a current density sufficient to drive a liquid crystal display device is obtained, and, although it differs with the current-voltage characteristic of the MIM element, it is generally 10 to 20 V. The current density of the MIM element within this voltage range is generally about 1 mA/cm$^2$ to 1 A/cm$^2$, but, from considerations of power consumption and the withstand voltage of the driver IC, it is preferably about 1 mA/cm$^2$.

The relationship between the value of S, equivalent to the slope of the straight line in FIG. 11, and the concentration of the tungsten added to the first conductive layer was further investigated. That is, the relationship between the coefficient S and the concentration of tungsten added to the first conductive layer was investigated under conditions of the current density $J_0$ of Equation 3 being 1 A/cm$^2$, 0.1 A/cm$^2$, 0.01 A/cm$^2$, and 0.001 A/cm$^2$. The results are shown in FIG. 12 and FIG. 13, where FIG. 12 shows the results obtained when chromium was used as the second conductive layer and FIG. 13 shows the results obtained when ITO was used as the second conductive layer.

It is clear from FIG. 12 and FIG. 13 that the coefficient S decreases as the tungsten concentration increases. Further, it is clear that the coefficient S depends on the current density, or rather, on the magnitude of the applied voltage, so that it decreases as the applied voltage decreases. Taking the example of the case in which the current is 1 mA/cm² (curve d), it is also clear that, to obtain a value of the coefficient S that is $3.1 \times 10^{-3}$ or less, the tungsten concentration should be approximately 0.3 atom % or more when the second conductive layer is chromium, and the tungsten concentration should be approximately 0.7 atom % or more when the second conductive layer is ITO.

Making the coefficient S of Equation 3 to be no more than $3.1 \times 10^{-3}$ ensures that when, for example, a liquid crystal display device is driven under conditions of a duty ratio of 1/200 to 1/2000 and a drive voltage of 10 V to 20 V, the display characteristics of the liquid crystal display device can be maintained satisfactorily for 10,000 hours with no generation of sticking image by long-term display.

In the nonlinear resistance element specified in claim 21, when the value of m in Equation 3 is 5 and the value of the coefficient S exceeds $3.1 \times 10^{-3}$, it is necessary to perform aging for at least a time t (second) such that Equation 4 below is satisfied. In this case, aging means that a voltage within a predetermined range is applied for a certain time to all the MIM elements arranged over the entire surface of the substrate.

$$\log (S/5) - (4/5) \log t < -3.2 \qquad \text{Equation 4}$$

This Equation 4 is derived from Equation 3 as follows:

$$\log (J/J_0) = S \times t^{1/5}$$

$$d \log (J/J_0)/dt = (S/5) \, t^{-4/5}$$

$$\log \{d\log (J/J_0)/dt\} = \log (S/5) - 4/5 \log t \qquad \text{Equation 7}$$

A graphical representation of Equation 7 is shown in FIG. 14. That is, in FIG. 14, log t is plotted along the X-axis and log {dlog (J/J₀)/dt} is plotted along the Y-axis. The intercept (log t=0) on the Y-axis of FIG. 14 gives log (S/5). Therefore, in order to make the coefficient S $3.1 \times 10^{-3}$:

$$\log (S/5) = \log ((3.1 \times 10^{-3})/5) = -3.2$$

Thus the time t necessary for aging that satisfies Equation 4 can be obtained from FIG. 14. For example, looking at the straight line d (1 mA/cm²) in FIG. 14, it can be seen that, at t=1 (seconds), the value derived from Equation 7 is approximately −3.0 and Equation 4 is not satisfied. However, at t=2 (seconds), this value is approximately −3.2 so that an aging time of at least approximately 2 seconds is necessary. Performing aging for a time t such that Equation 4 is satisfied in this manner ensures that Equation 3 can be satisfied subsequently, and so sticking image does not occur, even if the same pixels should display the same pattern for a long time, and favorable display characteristics can be maintained. Research performed by the present inventors has confirmed that, the characteristics obtained by performing aging in this manner can be maintained in the long term. Further, it has been confirmed that, if tungsten is not added to the first conductive layer, leaving the MIM element at room temperature will return the characteristics to their pre-aging values, and thus it is difficult to maintain the effect achieved by aging.

In accordance with this invention, the activation energy of the thermal stimulation current (TSC) in the insulating layer (anodized layer of the first conductive layer) is preferably less than 0.7 eV, and this TSC activation energy is even more preferably 0.3 eV or less. In order to achieve such a configuration, it is preferable that tungsten is added to the first conductive layer in a proportion of 0.1 to 6 atom %. The reason why the addition of tungsten reduces the TSC activation energy is by no means clear, but it is considered that the addition of tungsten lowers the levels of traps in the insulating layer.

The TSC activation energy is obtained by the measurement methods and approximations given in a paper in the *J. IEE Japan*, Vol. 108, No. 8, 1988, pp. 787–792.

The measurement points on the lines a in FIG. 15 are those for an anodized layer formed from an insulating layer of tantalum alone, and the measurement points on the lines b are those for an anodized layer formed from tantalum to which is added 2 atom % of tungsten.

From FIG. 15, it is clear that the TSC activation energy is markedly lower in the anodized layer when tungsten is added. Further, this activation energy is virtually independent of bias temperature and is substantially constant. Lowering the TSC activation energy makes it possible to reduce the value of the constant B in Equation 2. This is thought to be because the value of B in Equation 2 depends on the charge trapped in the insulating layer, and the addition of tungsten enables the formation of trap level that is much lower than that when no tungsten is added. Therefore the charge injected into the insulating layer is greatly reduced and, as a result, the value of the constant B is also lowered.

A method of manufacturing a nonlinear resistance element specified in claim 30 comprises the steps of: (a) depositing on a substrate a metal film whose main component is a metal to which is added a chemical element having a valence 1 or 2 greater than that of the main metal, in a proportion of 0.2 to 6 atom % and preferably to a thickness of 1500 to 5000 angstrom, to form a first conductive layer; (b) forming an insulating layer, preferably to a thickness of 300 to 750 angstrom, on the surface of the first conductive layer by an anodization method, and (c) forming a second conductive layer, preferably to a thickness of 300 to 2,000 angstrom, on the surface of the insulating layer.

In accordance with this manufacturing method, the metal of the first conductive layer is preferably tantalum, and the chemical element whose valence is greater than tantalum is preferably tungsten, molybdenum, chromium, rhenium, or tungsten oxide, and more preferably tungsten. Further, the second conductive layer is preferably formed of at least one of a chromium film and a transparent conductive film, more preferably a transparent conductive film.

In accordance with this manufacturing method, a first annealing process at a temperature of 300° C. to 400° C. is preferably performed after the insulating layer is formed. Further, in this manufacturing method, a second annealing process at a temperature of 230° C. to 260° C. and in an atomsphere comprising at least oxygen is preferably performed after the second conductive layer is formed.

The OFF current in particular of the resultant MIM element depends on the processing temperature in the first annealing process, so it is important to set the temperature range suitably. Performing thermal processing at a temperature of about 450° C. after the anodization would usually be expected to stabilize the anodized layer, but, if it is intended to reduce the cost of the manufacturing process by using an inexpensive soda glass instead of the conventional non-alkali glass as the substrate, for example, it would be necessary to reduce the processing temperature. However, if the processing temperature of the annealing is reduced, the OFF current of the element will increase, leading to deterioration of the contrast of the liquid crystal display device. For example, reducing the usual annealing temperature of 450° C. to 300° C., at which there are few unwanted effects such as expansion and contraction or cracking of the glass, a rise of approximately two orders of magnitude in the OFF current would be seen in an MIM element that uses tantalum. Research performed by the present inventors has, however, confirmed that adding tungsten to the tantalum suppresses this rise in the OFF current, so that the difference in OFF current can be held to be within approximately 1.5 orders of magnitude, even when the processing temperature is reduced from approximately 450° C. to approximately 300° C., exhibiting virtually no effect on the display characteristics.

Experiments intended to illustrate this point will now be described. These experiments investigated the current density of a plurality of sample elements obtained by varying the tungsten concentration and the temperature of the first annealing process. Data obtained when chromium was used as the second conductive layer is shown in FIG. 16 and FIG. 17, and data obtained when ITO was used as the second conductive layer is shown in FIG. 18 and 19. In FIG. 16 and FIG. 18, tungsten concentration is plotted along the X-axis and current density (log J) along the Y-axis. Similarly, in FIG. 17 and FIG. 19, annealing temperature is plotted along the X-axis and current density (log J) along the Y-axis.

From FIG. 16 and FIG. 18, it is clear that adding tungsten to the tantalum film lowers the OFF current (bias voltage: 4 V), within a certain concentration range, and the amount of change in the current density with respect to change in annealing temperature is small.

More specifically, from FIG. 16, it is clear that if at least 0.2 atom % of tungsten is added, the amount of change in the current density J is held to be about 1.5 orders of magnitude (whereas, when tungsten is not added, it is about 2.5 orders of magnitude) when the processing temperature is reduced from 450° C. to 300° C., and the amount of change in the current density is suppressed to about 1 order of magnitude when the processing temperature is reduced from approximately 400° C. to approximately 300° C.

From FIG. 17, it is clear that the dependence of the OFF current on the annealing temperature can be reduced. More specifically, when tungsten is not added (curve a), the slope of the curve is large, and thus the current density (log J) changes greatly with change in temperature. In contrast, the slopes of curves b to f when tungsten is added to the tantalum are low, and moreover these are gentle curves in which the slope decreases with increasing tungsten concentration, so that the OFF current is not very dependent on annealing temperature.

The above results show that adding tungsten to the tantalum in a proportion of approximately 0.2 atom % to 6 atom % enables a reduction of the annealing temperature of the first annealing process to about 300° C. However, it should be noted that, if the annealing temperature is below 300° C., asymmetry will be seen in the voltage-current characteristic when bias voltages of changing polarities are applied to the MIM element, so that the annealing process should preferably not be performed at a temperature lower than this. On the other hand, if, for example, an inexpensive soda glass is used as the substrate, from consideration of characteristics such as thermal expansion, the annealing process should be performed at a temperature of no more than 450° C., preferably no more than 400° C.

Further, when ITO is used as the second conductive layer, a tendency similar to that when chromium is used as the second conductive layer can be seen, as shown in FIG. 18 and FIG. 19. From FIG. 18, if the tungsten concentration is 0.2 atom % or more, the amount of change in the OFF current can be suppressed to approximately 1.5 orders of magnitude. Further, from FIG. 19 it is clear that, if the annealing temperature exceeds approximately 350° C., the slope of the curve becomes gentler and the amount of change in the OFF current becomes smaller. Therefore, when ITO is used as the second conductive layer, the temperature of the first annealing process should be at least 300° C., preferably at least 350° C., but no more than 450° C., preferably no more than 400° C. To enable such an annealing process, the tungsten concentration should preferably be at least 0.4 atom %. However, it should be noted that, as can be seen from FIG. 18, if the tungsten concentration is too great, the OFF current will rise again, so it is preferable that the tungsten concentration does not exceed, for example, 3 atom %.

During the step of forming the second conductive layer (step c) in the manufacturing method of this invention, the second conductive layer is preferably formed of a thin film of ITO, and this thin film is preferably formed by sputtering in an atmosphere in which the ratio of oxygen to argon (oxygen/argon) has a volumetric ratio between $5 \times 10^{-5}$ and $1.2 \times 10^{-2}$.

When a thin ITO film is used as the second conductive layer, the quality of that film has a profound effect on the elements characteristics. The quality of ITO film depends on the conditions under which is formed, more specifically, it is determined by factors such as the power, gas flow quantity, temperature, and pressure during the sputtering. Research performed by the present inventors has confirmed that, of these conditions, the gas composition used in the sputtering has the greatest effect on the MIM element. More specifically, setting the flow ratio of oxygen and argon to within the above range ensures that the absolute value of the constant B in Equation 2 can be made to be no more than 0.2.

Data on experiments designed to confirm this point is shown in FIG. 20. In FIG. 20, the flow ratio of oxygen and argon is plotted along the X-axis and the constant B of Equation 2 is plotted along the Y-axis. Note that, in these experiments, the sputtering conditions were: power, 1.7 kW; temperature, 200° C.; pressure, $5 \times 10^{-1}$ Pa; gas flow of argon, 100 sccm; and gas flow of oxygen, 0 to 10 sccm. From FIG. 20, it can be seen that the value of the constant B varies discontinuously with gas flow ratio. It can also be seen that it is necessary to make the flow ratio of oxygen and argon to be within the above range in order to ensure that the value of B is no more than 0.2. Further, setting the flow ratio to between $1.6 \times 10^{-4}$ and $1.0 \times 10^{-2}$ is more preferable, because the value of the constant B drops to 0.1 or less.

Further research performed by the present inventors has determined that, the flow ratio of oxygen and argon has an effect on the crystal structure of ITO. More specifically, it has been confirmed that, when the flow ratio of oxygen and argon is within a suitable range, the ITO forms polygonal granular crystals and the ratio of long axis to short axis (long axis/short axis) of a single crystal is, on average, approximately 3 to 1. In this case, long axis refers to the longest axis passing through the center of gravity of the crystal structure and short axis refers to the shortest axis passing through this center of gravity.

Scanning electron microscope (SEM) photographs of surfaces of ITO films are shown in FIGS. 37 to 40. FIG. 37 is an SEM photograph of an ITO film surface obtained when the flow ratio of oxygen and argon was $4.0 \times 10^{-4}$, FIG. 38 is one obtained when the flow ratio of oxygen and argon was $5.0 \times 10^{-3}$, FIG. 39 is one obtained when the flow ratio of oxygen and argon was $1.0 \times 10^{-2}$, and FIG. 40 is one obtained when the flow ratio of oxygen and argon was $4.0 \times 10^{-2}$. In FIGS. 37 and 38, the flow ratio of oxygen and argon was within the preferable range, and clear polygonal granular crystal can be seen therein. In contrast, in FIG. 39, the flow ratio of oxygen and argon is close to the boundary of the rage specified by this invention, and it can be seen that the ITO in this case forms long, thin granular crystals with a large ratio of long axis to short axis. In FIG. 40, the flow ratio of oxygen and argon is greater than the range of this invention, and it can be seen that the ITO in this case forms long, thin granular crystals with a ratio of long axis to short axis that is similarly large.

In order to satisfy all of the experimental equations and manufacturing conditions described above, if the second conductive layer is formed from chromium, the concentration of tungsten added to the first conductive layer should be 0.2 to 6 atom %, preferably 0.3 to 3 atom %, and more preferably 0.8 to 3 atom %. If the second conductive layer is formed of ITO, the concentration of tungsten added to the first conductive layer should be 0.2 to 6 atom %, preferably 0.3 to 4.5 atom %, and more preferably 0.5 to 4.5 atom %.

This invention also makes it possible to reduce the dependency of the current characteristic of the MIM element on dimensions. This will be described in more detail below.

Amongst the desire to make liquid crystal display devices more tightly integrated and with greater capacities, it is demanded to make the MIM elements used for driving even smaller. However, the present inventors have determined that there is a large dependence on element dimensions in a prior art MIM element (an element in which a tantalum film without any added tungsten is used as the first conductive layer). In other words, for example, if an element of the dimensions of the previously described samples (4 $\mu$m×4 $\mu$m) and an element of dimension 2 $\mu$m×2 $\mu$m are compared, the latter one will have a current density of approximately 1 order of magnitude smaller than that of the former, with a correspondingly larger resistance. The reason for this is thought to be because the resistance of a flat portion of an MIM element differs from that of a side surface portion thereof, it is more difficult for a current to flow through a side surface portion than a flat portion, the proportion of side surface portions becomes relatively greater as the dimensions of an element decrease, and thus the current decreases as the element becomes smaller. Therefore, if the dimensions of an element are reduced, it becomes necessary to devise some means such as increasing the drive voltage or the withstand voltage of the driver IC, and this is not preferable from the power consumption and cost viewpoints.

However, the present inventors have confirmed that the above described dimensional dependency can be greatly reduced in the element in accordance with this invention by adding tungsten to the first conductive layer. The relationship between current density while the ON voltage (15 V) is applied and element area is shown in FIG. 41. In this figure, the density ($J_{(S=16)}$) of the current flowing through an MIM element of dimensions 4 $\mu$m×4 $\mu$m is taken as a baseline, and the current densities ($J_s$) of other elements are compared therewith. In FIG. 41 elements with no added tungsten (curve a) and elements with different tungsten concentrations (curves b to e) are shown. From this figure, it is clear that, when the dimensions of an element that does not contain tungsten are reduced from 4 $\mu$m×4 $\mu$m to 2 $\mu$m×2 $\mu$m, the current density drops by approximately 1 order of magnitude, but if, for example, 2 atom % of tungsten is added, the drop in current density is only 0.05 orders of magnitude, even under the same conditions. It is also clear from this figure that the drop in current density concomitant with decreasing dimension is reduced as the tungsten concentration is increased.

In this way, adding tungsten to the first conductive layer can suppress the drop in current density caused by making the element smaller.

A liquid crystal display device of this invention comprises: a first substrate provided with a transparent substrate, signal electrodes arranged in a predetermined pattern on the substrate, nonlinear resistance elements as laid out in any one of claims 1 to 29 connected to the signal electrodes at a predetermined pitch, and pixel electrodes connected to the second conductive layers of the nonlinear resistance elements; a second substrate provided with opposing signal electrodes positioned to be opposite to the pixel electrodes; and a liquid crystal layer sealed between the first electrode substrate and the second electrode substrate.

DESCRIPTION OF THE PREFERRED EMBODIMENT

Preferred embodiments will be described below, to specify the present invention in detail.

First Embodiment

Figure 23:
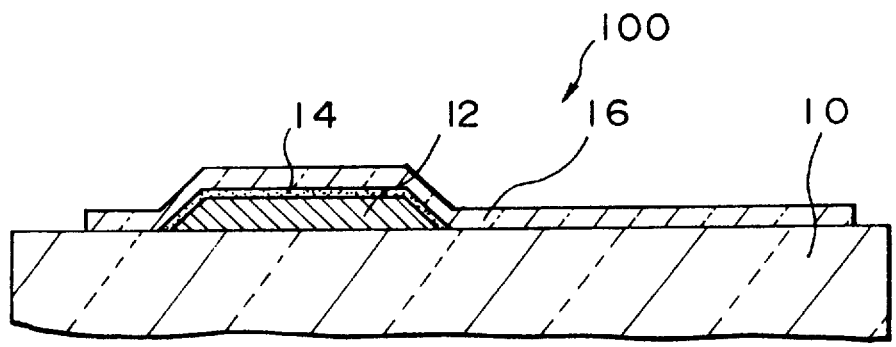
FIG. 23 is a cross sectional view simply showing the MIM element of the first embodiment (a cross section taken along the line A—A in FIG. 24)
Figure 24:
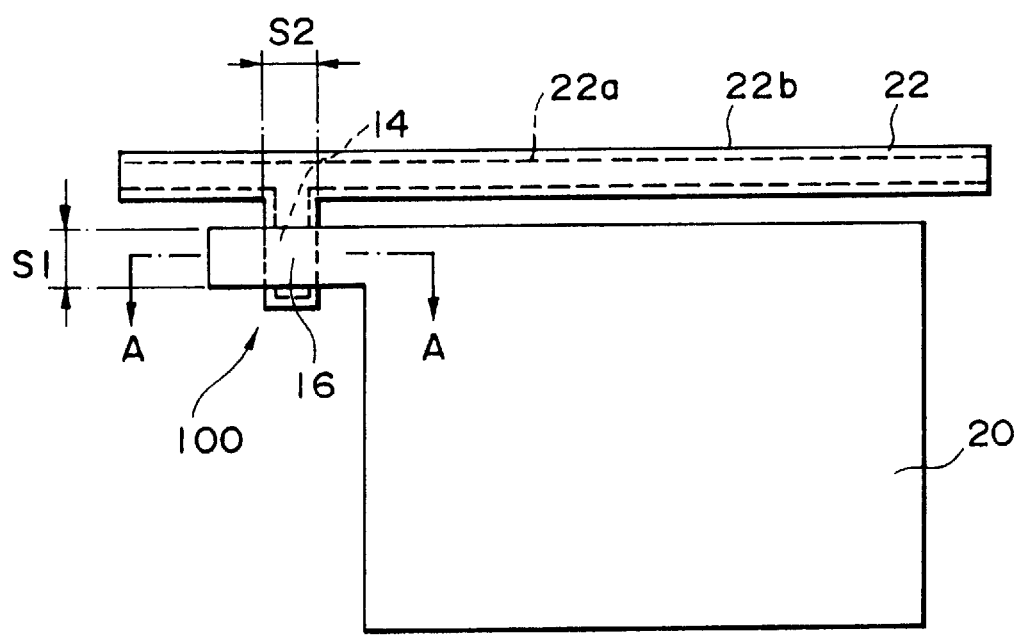
FIG. 24 is a plane view of a unit electrode that forms an active matrix type of electrode substrate to which the MIM element of the first embodiment is applied.

A cross sectional view simply showing an MIM element 100 of a first embodiment of the invention is shown in FIG. 23, and a plan view of a unit liquid crystal drive electrode that uses this MIM element is shown in FIG. 24. FIG. 23 is a section taken along the line A—A in FIG. 24.

The MIM element 100 comprises a substrate 10 formed of a material that is insulating as well as transparent, such as glass or plastic; a first conductive layer 12 formed on the surface of this substrate 10 of tantalum to which is added tungsten in a proportion of 0.2 to 6 atom % (in this embodiment: approximately 2 atom %) and having a film thickness of 1500 to 5000 angstrom; an insulating layer 14 formed on the surface of the first conductive layer 12 by an anodization method and having a film thickness of 300 to 700 angstrom; and a second conductive layer 16 formed on the surface of the insulating layer 14 and having a film thickness of about 300 to 2000 angstrom.

This MIM element 100 could, for example, be manufactured by the processing described below.

(A) First, a film of tantalum containing a predetermined concentration of tungsten is deposited on the substrate 10. In this case, the thickness of the tantalum film is selected to be suitable for application in which the MIM element is to be used, and is usually about 1500 to 5000 angstrom (in this embodiment: 3000 angstrom). The method of depositing a tantalum film that includes tungsten could be one that uses sputtering from a mixed target or simultaneous sputtering, the former being particularly preferable. The mixing ratio of the tantalum and tungsten in the mixed target is set to correspond to the combination ratio of the first conductive layer that is to be formed. The mixed target could be, for example, powders of ultra-fine particles of tantalum and tungsten (of, for example, 500 to 10000 angstrom, preferably 1000 to 3000 angstrom, and in this embodiment: about 2000 angstrom), the two powders being mixed and then sintered at 300° C. or more, or an alloy formed by melting tantalum and tungsten together. Using a mixed target in this way as the target for sputtering, instead of performing simultaneous sputtering using separate targets, ensures the homogeneity of the first conductive layer, specifically, it ensures that the tungsten does not form local lumps.

Figure 21:
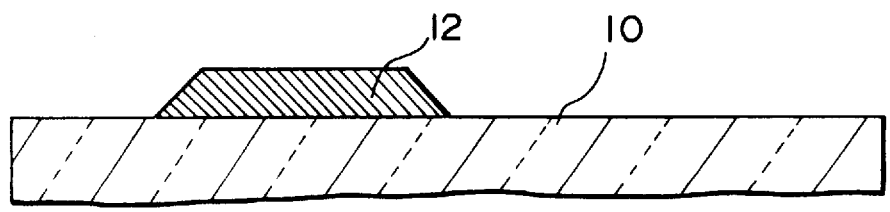
FIG. 21 and FIG. 22 are cross sectional views simply showing the manufacturing process of the MIM element of a first embodiment of this invention.

Next, the tantalum film is patterned by generally-used photolithography and etching techniques to form the first conductive layer 12 and a conductive portion 22a for a timing signal line 22 (see FIG. 21 and FIG. 24). The patterning could be achieved by, for example, coating the entire surface of the substrate 10 with resist, then exposing it by using a mask, and developing it to form a resist pattern which is used for etching. Among the etching methods that could be used are dry etching using a mixture of $CF_4$ and $O_2$ gases or wet etching using an etching liquid that is a mixture of fluorine and sulfuric acid.

Figure 22:
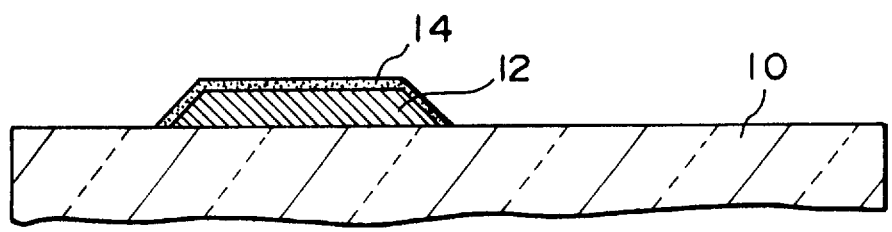

(B) Next, an upper portion of the first conductive layer 12 is oxidized by an anodization method to form the insulating layer 14 and an insulating portion 22b for the timing signal line 22 (see FIG. 22 and FIG. 24). This insulating layer 14 is also of a film thickness suitable for application of the MIM element, and is usually of about 300 to 700 angstrom. In this embodiment, an insulating layer with a film thickness of approximately 530 angstrom could be obtained by anodization in a 0.01% by weight aqueous solution of citric acid at a constant voltage of 30 V for approximately 2 hours.

(C) Next, a first annealing process is performed at a temperature of approximately 300° to 400° C. (in this embodiment: 400° C.) for 0.5 to 2 hours (in this embodiment: 1 hour). This annealing process is usually performed in an inert gas atmosphere such as nitrogen or argon, or in an atmosphere of oxygen or mixture of argon and hydrogen.

Performing this annealing process ensures that the chemical structure of the insulating layer (anodized layer) can be stabilized. In this embodiment, the addition of a specific concentration of tungsten to the first conductive layer 12 ensures that the temperature of this annealing process can be made lower than the usual temperature (approximately 450° C.). As a result, the substrate is hardly affected by expansion and contraction due to heat, even if it is made of soda glass, for example. However, it should be noted that reducing the annealing temperature to less than 300° C. will lower the symmetry of the current-voltage curve of the MIM element.

(D) Next, an ITO film of a thickness of about 300 to 2000 angstrom (in this embodiment: 1000 angstrom) is deposited by sputtering and is then patterned using photolithography and etching techniques, to form the second conductive layer 16 and a pixel electrode 20 (see FIG. 23 and 24). The conditions of the sputtering are: power, 1.7 kW; temperature, 200° C.; pressure, $5\times10^{-1}$ Pa; and flow ratio of oxygen and argon, $5\times10^{-3}$. Forming the second conductive layer 16 of ITO in this manner means that the second conductive layer 16 and the pixel electrode 20 can be formed in the same step, simplifying the manufacturing process.

(E) After that, a second annealing process is performed at a temperature of 230° C. to 260° C. (in this embodiment: 250° C.) for 0.5 to 4 hours (in this embodiment: 2 hours). The annealing is preferably performed in an atmosphere that includes oxygen in a proportion of 5 to 100%, or even more preferably 50 to 100%. Other than oxygen, a gas such as nitrogen or argon could be used.

Figure 25:
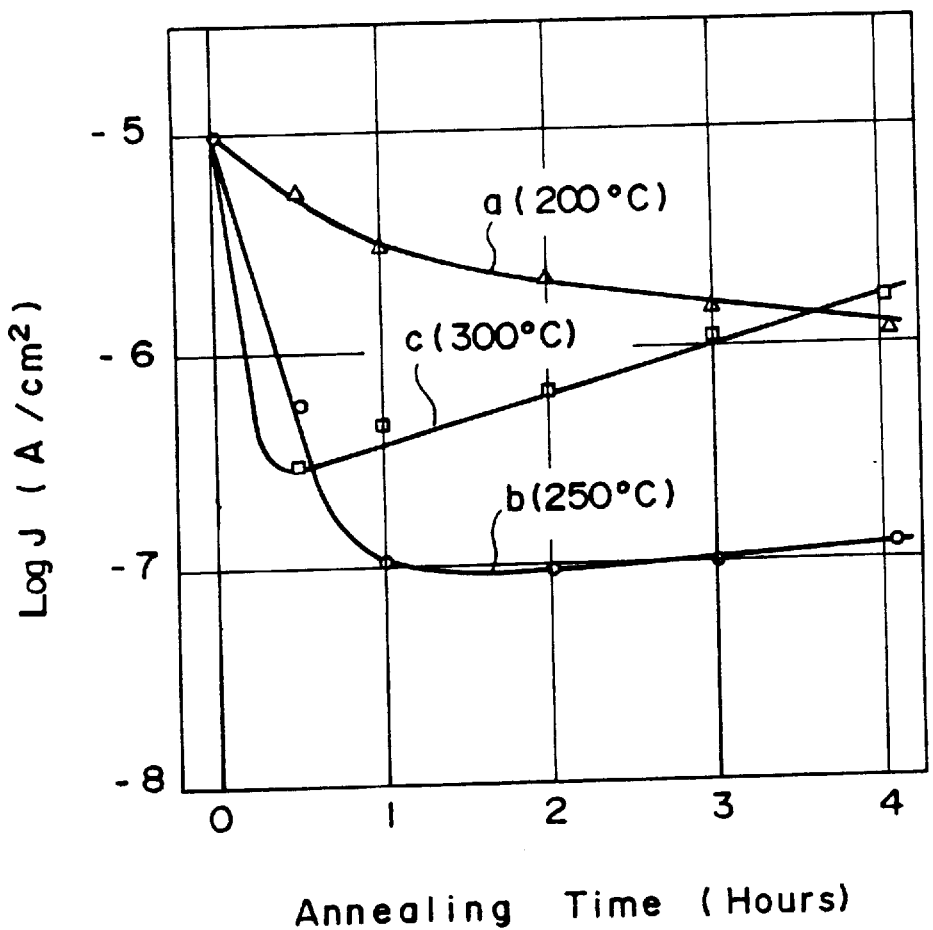
FIG. 25 is a graph of current density plotted against annealing time, when the temperature of the second annealing process in the manufacturing process of the first embodiment is varied.

Experimental results relating to the second annealing process will now be discussed. The relationships between annealing temperature and time of the second annealing process and the OFF current of the thus-formed MIM element are shown in FIG. 25. The samples used for these experiments were manufactured by the process of these embodiment, under the same conditions except for the second annealing temperature, and the second annealing process was performed in a nitrogen atmosphere that included 50% oxygen. In FIG. 25, curve a shows the changes in OFF current when the annealing process was performed with an annealing temperature of 200° C., curve b shows that for 250° C., and curve c shows that for 300° C. For example, with an annealing temperature of 200° C., the OFF current decreases as annealing time increases, and the rate of this decrease gets smaller and continues to change as time passes. When the annealing temperature is 300° C., the OFF current falls initially within about 20 to 30 minutes after the start of annealing, but then rises continuously so that this current characteristic is not stable. Finally, when the annealing temperature is 250° C., the OFF current drops greatly during approximately 1 hour of thermal processing, but subsequently reaches a substantially stable value. This trend has been confirmed to exist over the range of 230° C. to 260° C.

Figure 26:
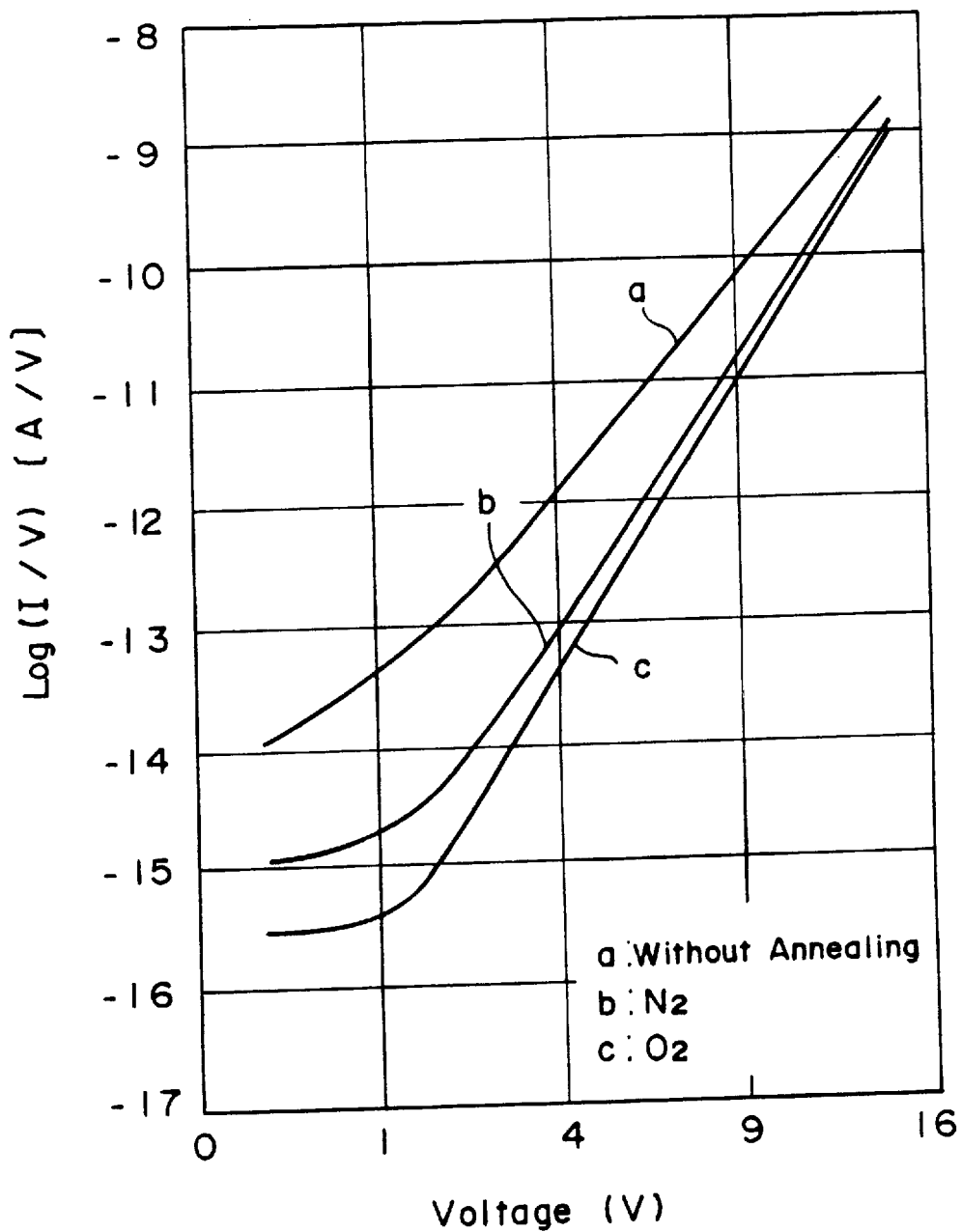
FIG. 26 is a graph illustrating the relationship between voltage and current, when the type of gas used in the atmosphere of the second annealing process is varied.

Experiments into the atmosphere of the second annealing process will now be described. The relationship between voltage and current after annealing performed in different atomosphere is shown in FIG. 26. In FIG. 26, curve a shows the results when no annealing was performed, curve b shows the results when annealing was performed in a nitrogen atmosphere, and curve c shows the results when annealing was performed in an oxygen atmosphere. From FIG. 26, it can be confirmed that the OFF current of the element is less when annealing is performed than when annealing is not performed, and that, when annealing is performed, annealing in an oxygen atmosphere reduces the OFF current more than annealing in a nitrogen atmosphere. This reduction in OFF current is thought to be due to oxygen atoms in the environment being diffused by the thermal processing as far as the insulating layer and also the insulating layer-metal boundary, where they are embedded in traps in these regions.

The dimensions of the MIM element obtained as described above are selected from the viewpoints of factors such as application and function, but one side is usually about 1 to 10 $\mu$m. In the MIM element of this embodiment 100, the dimensions S1 and S2 in FIG. 24 are both 4 $\mu$m.

Results of experiments on the characteristics of the MIM element 100 will now be described.

(1) Symmetry When Voltages of Different Polarities are Applied

Figure 27:
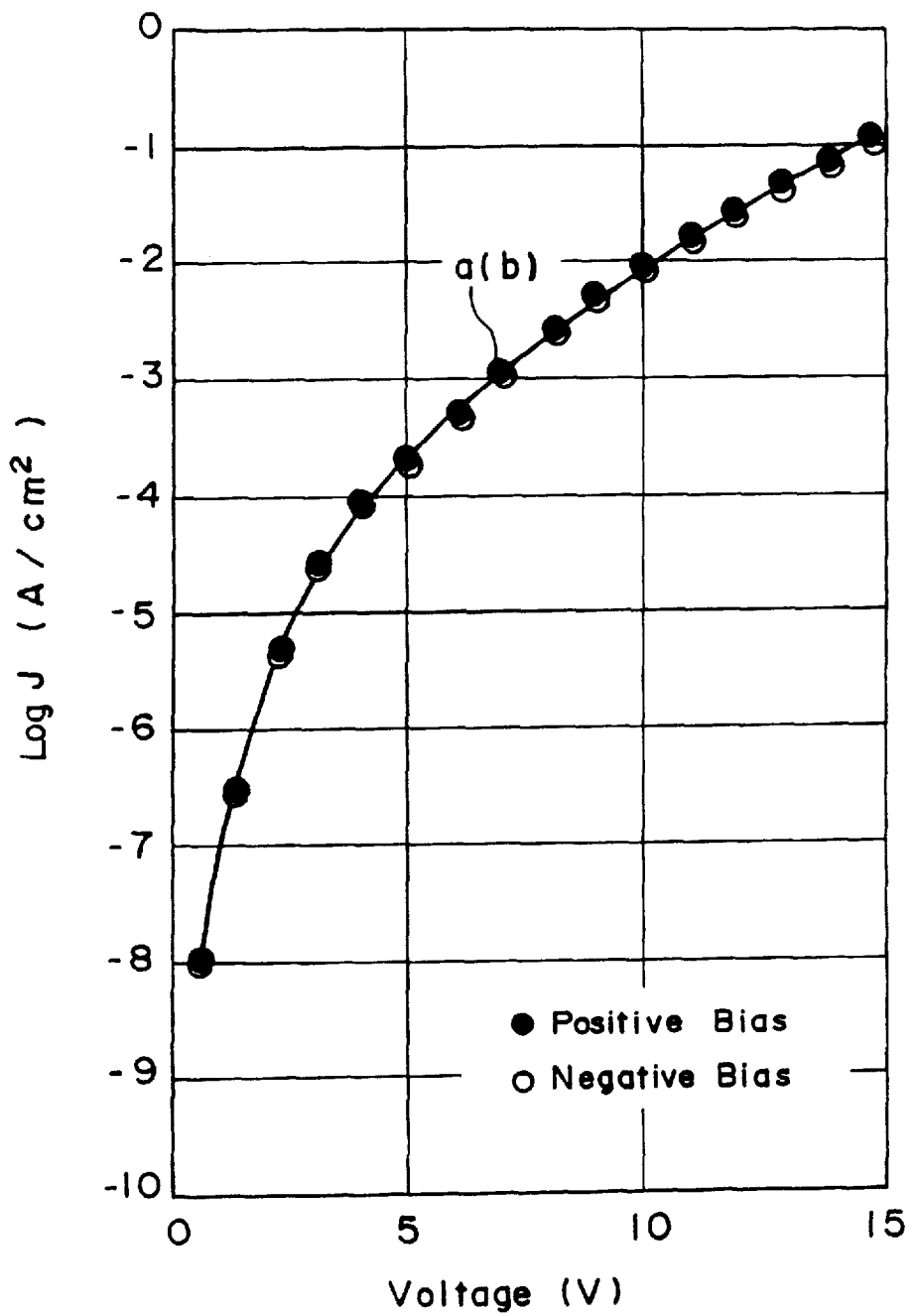
FIG. 27 is a graph of current density plotted against voltage, when the polarity of the voltage applied to the MIM element of the first embodiment is varied.

The voltage-current characteristics measured for the MIM element of this embodiment is shown in FIG. 27. In FIG. 27, curve a plotted with solid circles shows the voltage-current density (log J) curve when a positive bias voltage has been applied, and curve b plotted with hollow circles shows that when a negative bias voltage has been applied. From FIG. 27, it was confirmed that voltage-current curves obtained from the MIM element of this embodiment when voltages of different polarities were applied are substantially completely identical, showing an extremely high level of symmetry. The reason why such results were obtained is thought to be because the formation of an insulating layer by anodizing a metal film to which a specific concentration of tungsten is added creates substantially equal barrier heights at the boundary between the first conductive layer and the insulating layer and the boundary between the insulating layer and the second conductive layer.

Figure 28:
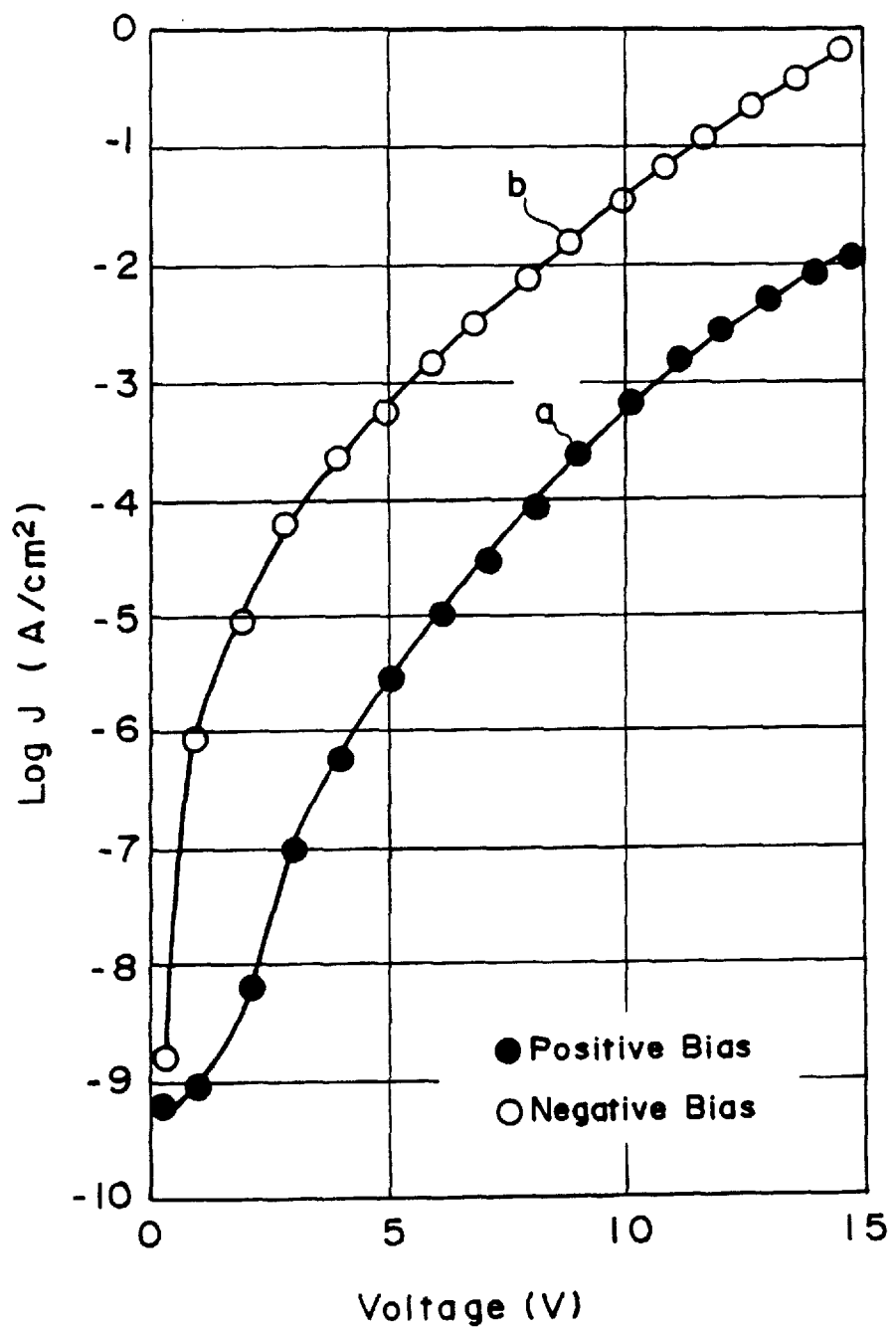
FIG. 28 is a graph of current density plotted against voltage, when the polarity of the voltage applied to a comparative MIM element is varied.

A MIM element was manufactured as a comparative sample by the same method as that of this embodiment, except that no tungsten was added to the tantalum film, and the voltage-current characteristic of this element was investigated in the same manner. These results are shown in FIG. 28. From FIG. 28, it was confirmed that, when tungsten is not added to the tantalum film, the voltage-current curves obtained when a positive bias voltage was applied (curve a) and that obtained when a negative bias voltage was applied (curve b) were considerably shifted, so that good symmetry could not be obtained.

(2) Notes on Short-term Changes in Characteristics

Figure 1:
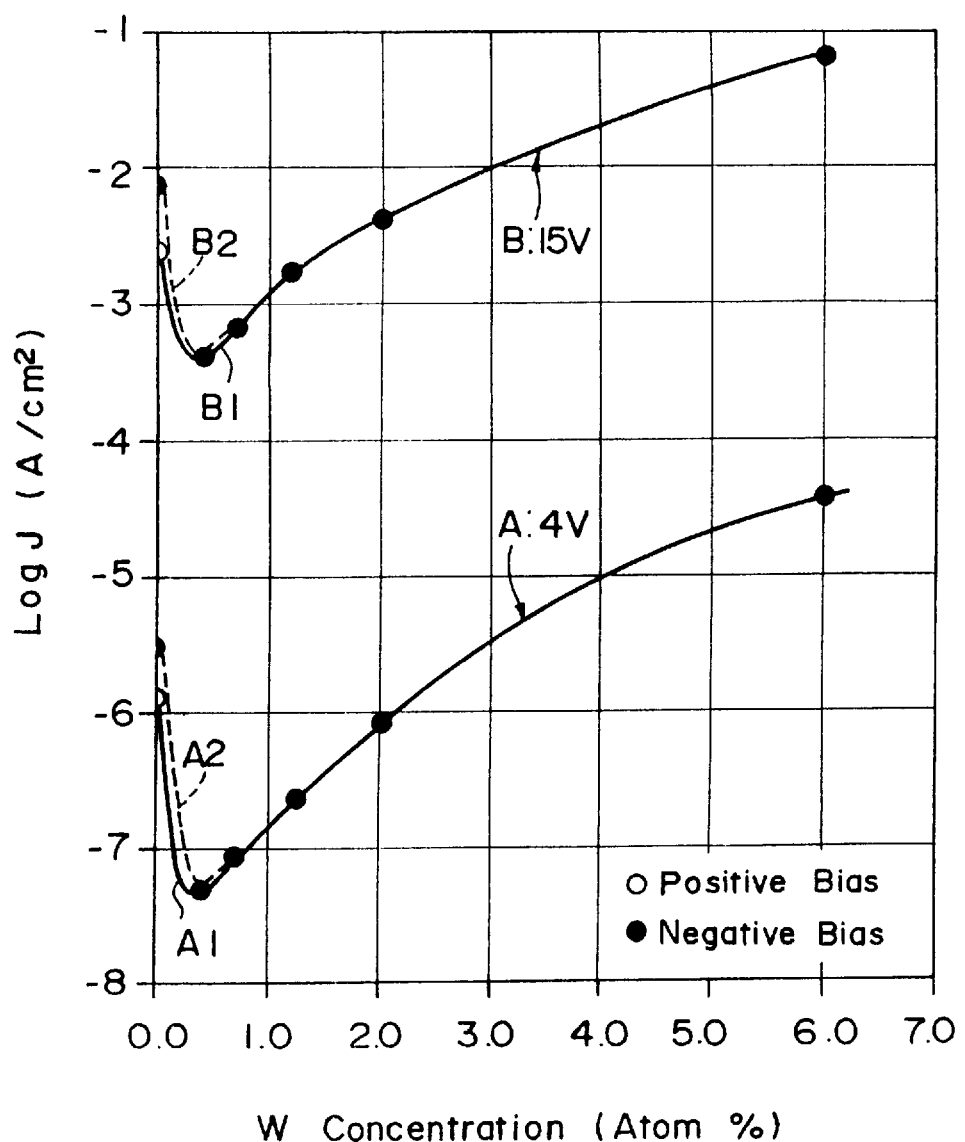
FIG. 1 is a graph of current density in MIM elements plotted against the concentration of tungsten added to the tantalum film, when a chromium film is used as the second conductive layer.
Figure 2:
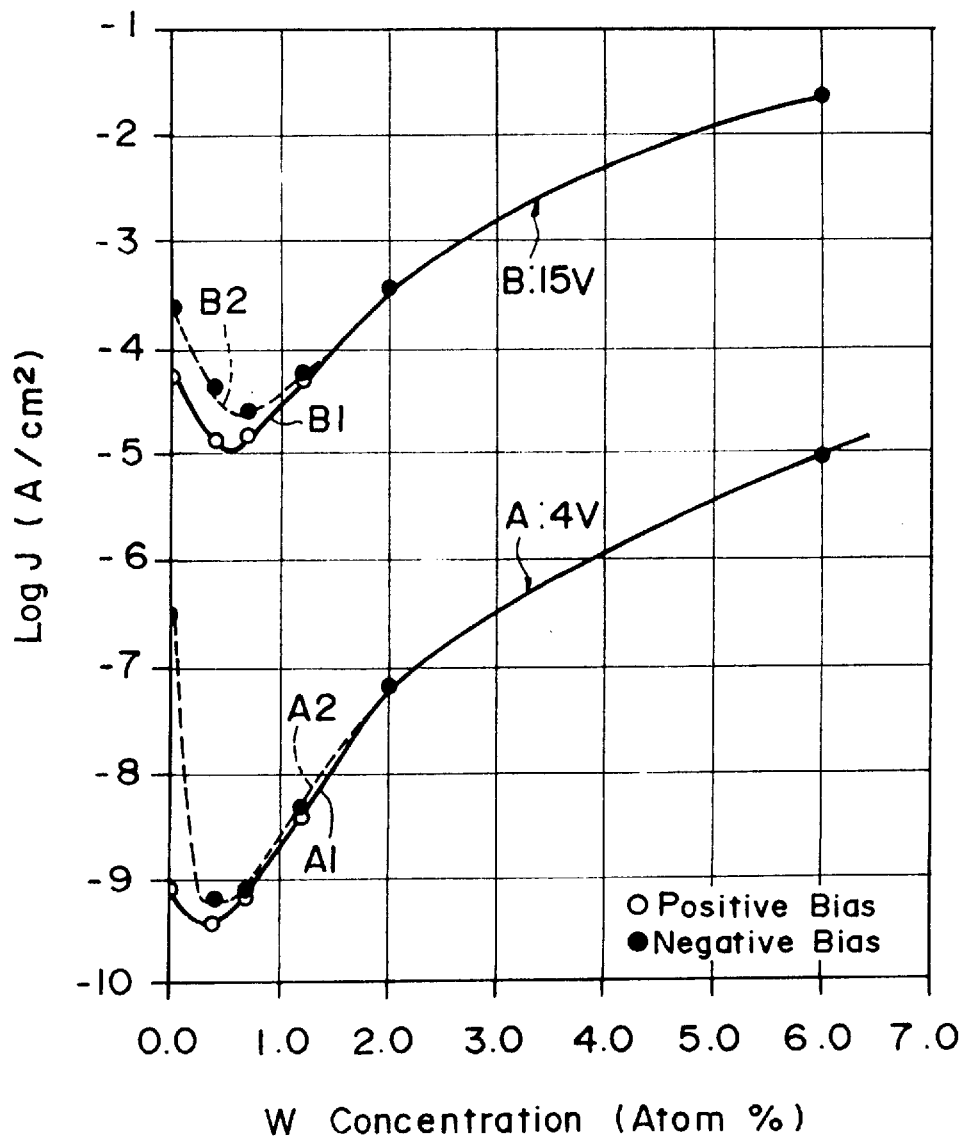
FIG. 2 is a graph of current density in MIM elements plotted against the concentration of tungsten added to the tantalum film, when an ITO film is used as the second conductive layer.
Figure 3:
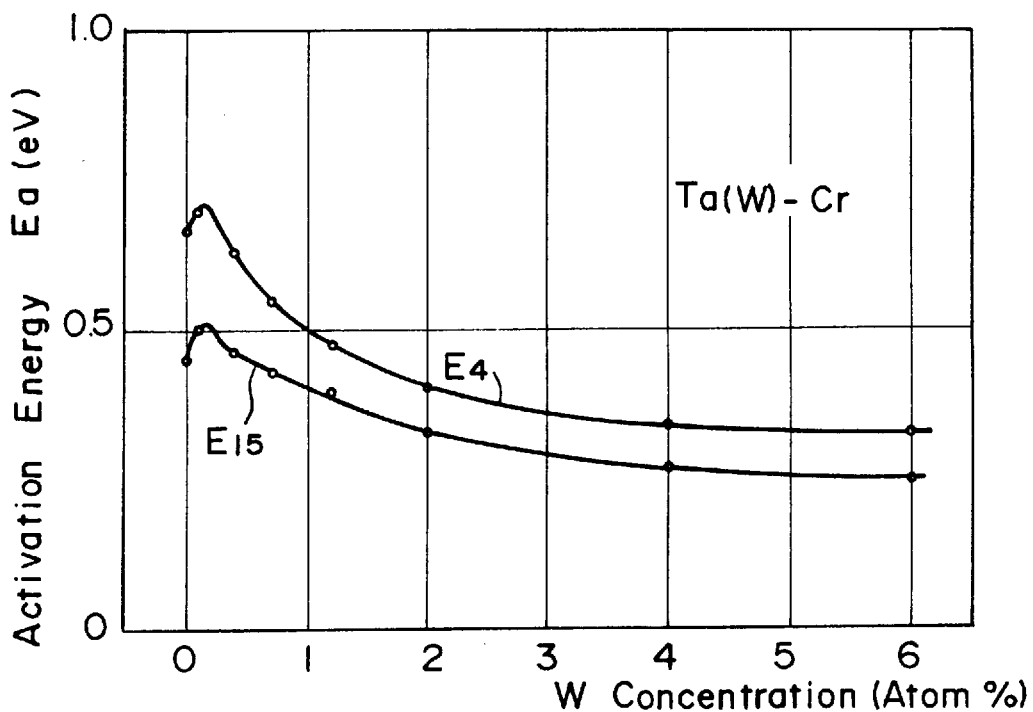
FIG. 3 is a graph of activation energy plotted against the concentration of tungsten added to the tantalum film, when chromium is used as the second conductive layer.
Figure 4:
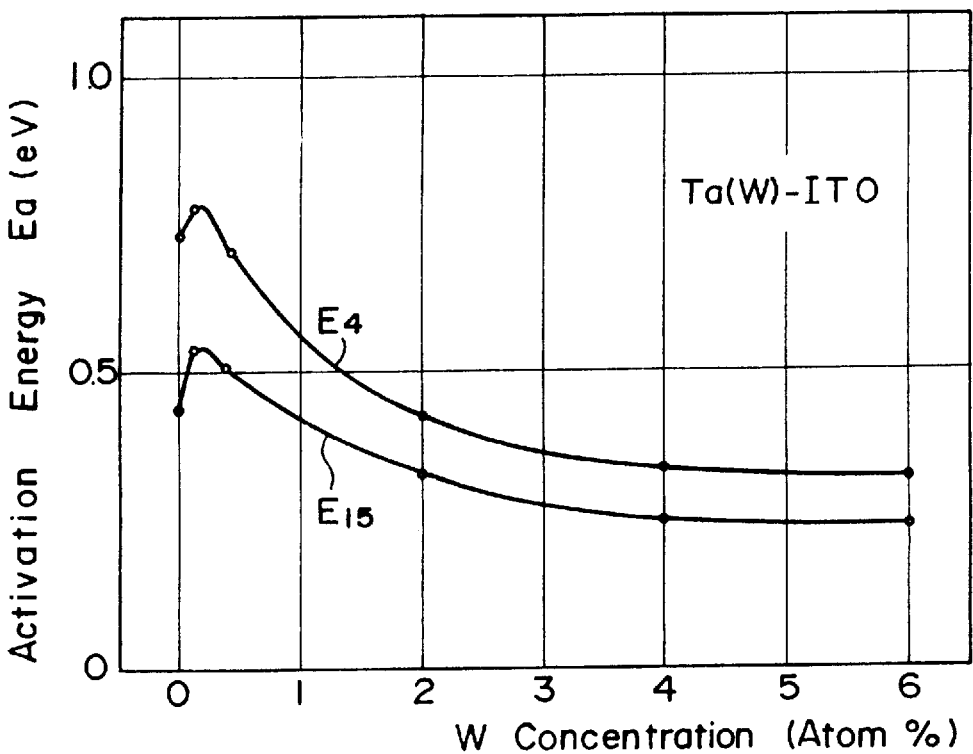
FIG. 4 is a graph of activation energy plotted against the concentration of tungsten added to the tantalum film, when an ITO film is used as the second conductive layer.
Figure 5:
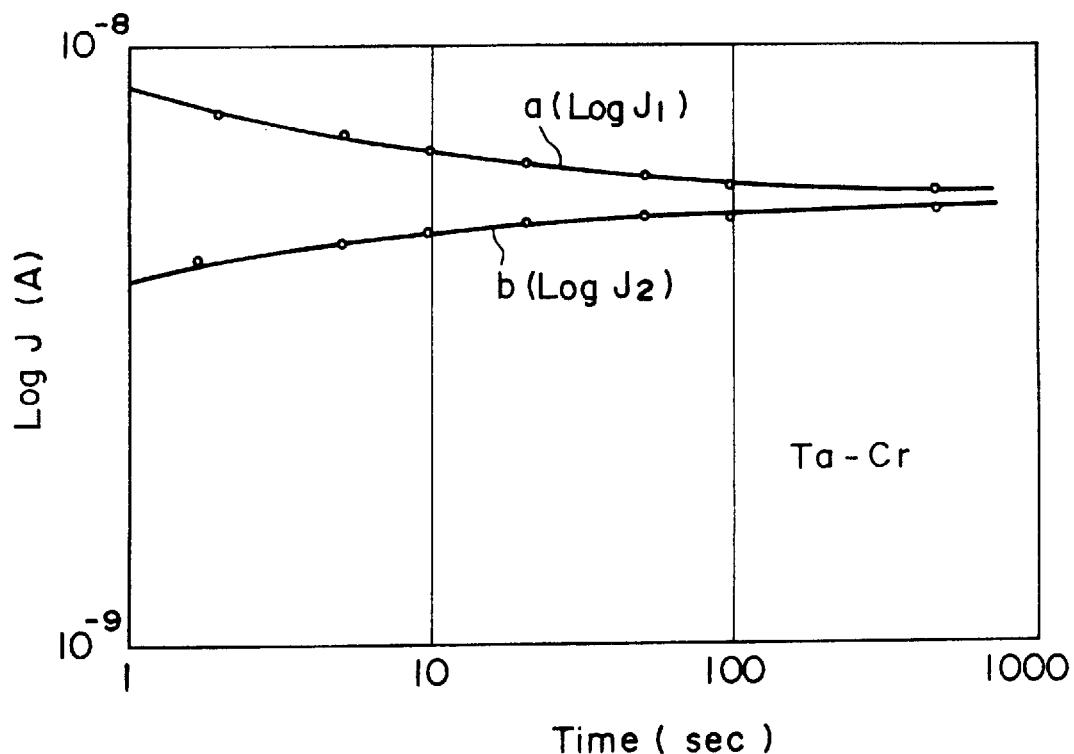
FIG. 5 is a graph of current density in the MIM element plotted against time, during constant-voltage drive when current injection was performed and when current injection was not performed.
Figure 6:
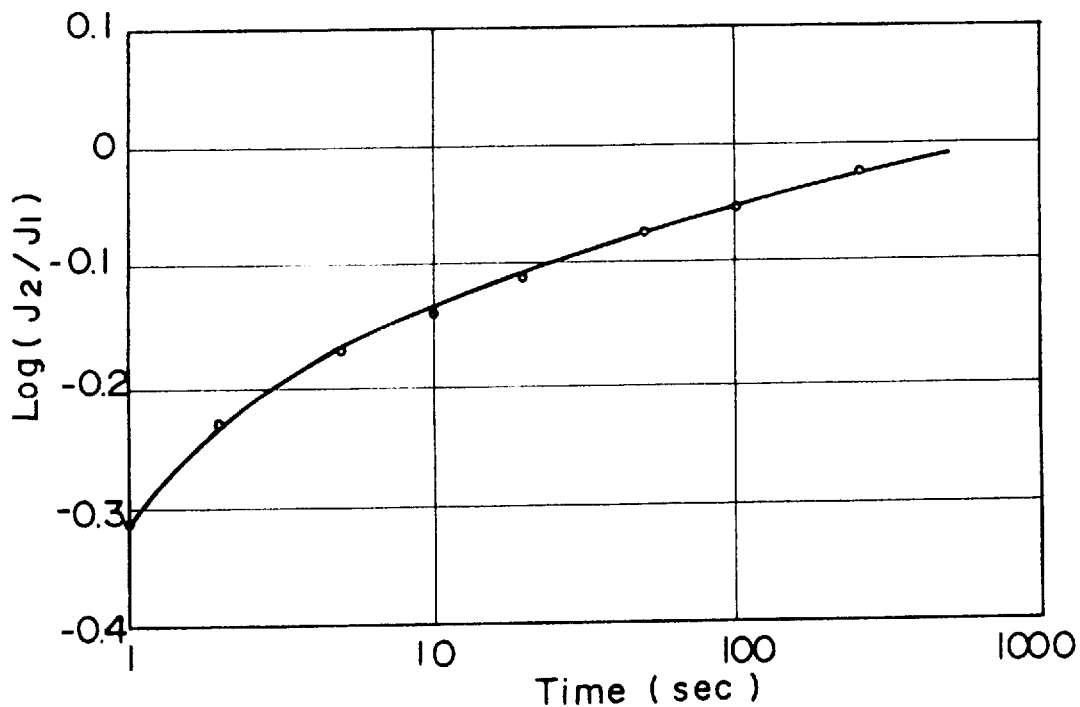
FIG. 6 is a graph of difference in current density plotted against time, obtained from FIG. 5.
Figure 7:
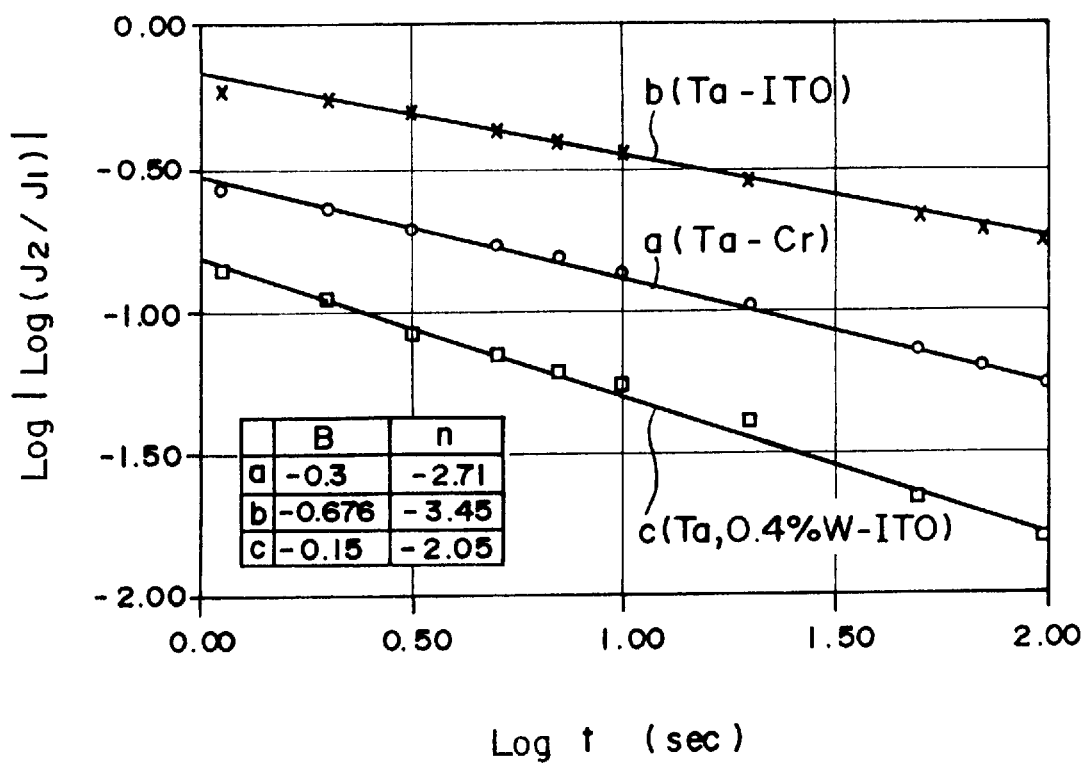
FIG. 7 is a graph of difference in current density plotted against time, for obtaining the values of constants B and n in Equation 2.
Figure 8:
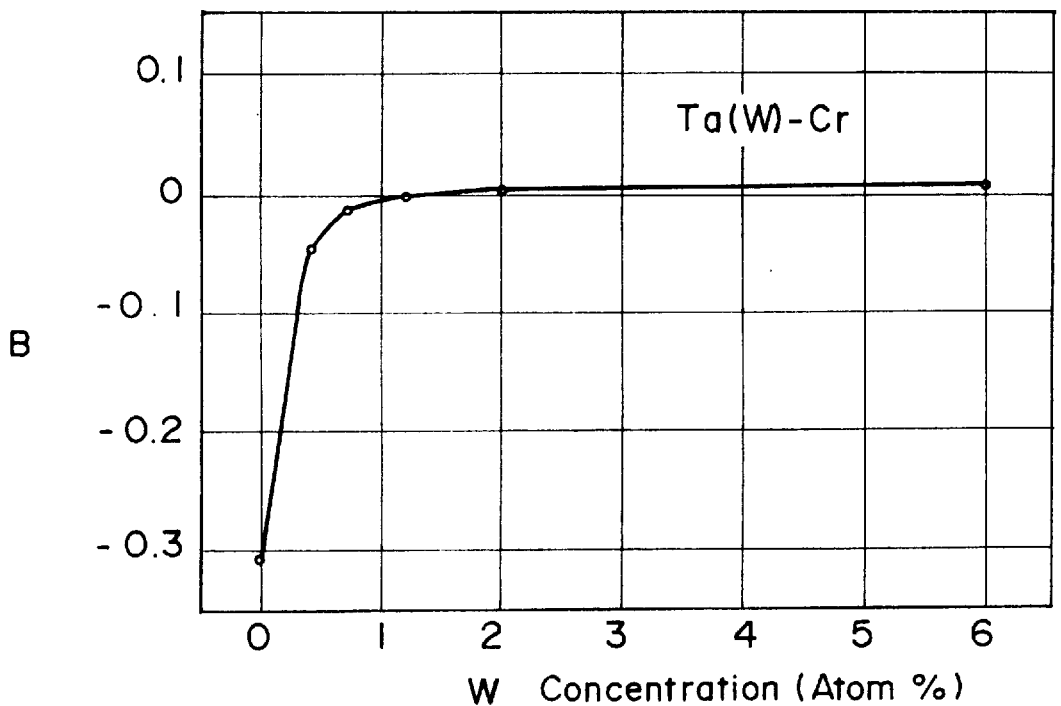
FIG. 8 is a graph of the constant B of Equation 2 plotted against the concentration of tungsten added to the tantalum film, when chromium is used as the second conductive layer.
Figure 9:
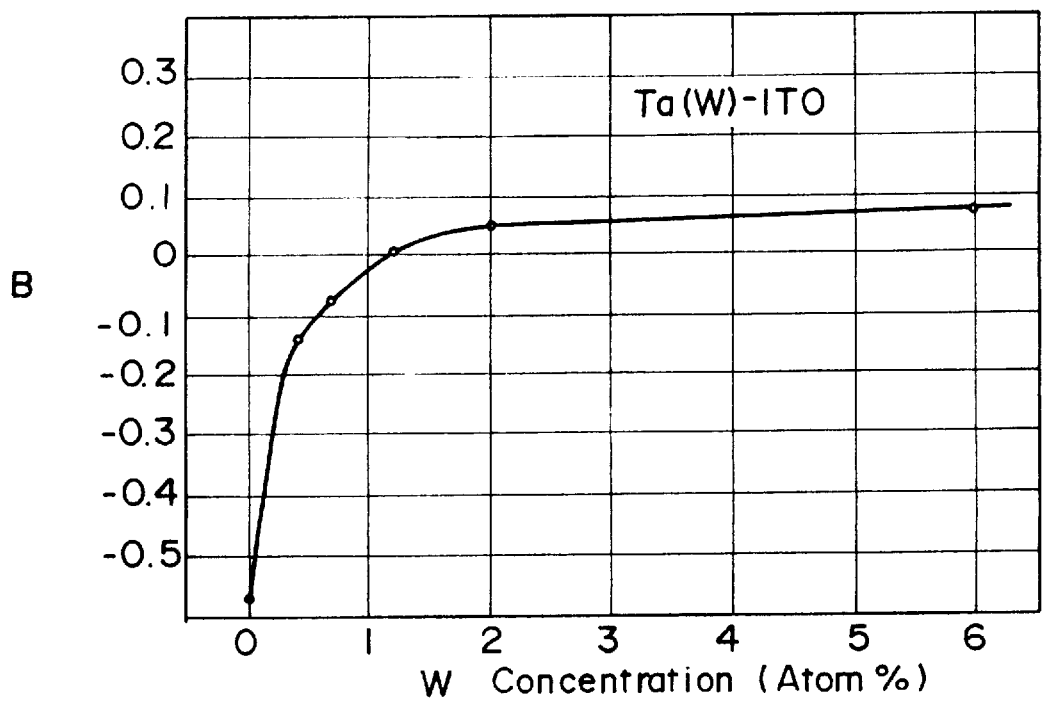
FIG. 9 is a graph of the constant B of Equation 2 plotted against the concentration of tungsten added to the tantalum film, when ITO is used as the second conductive layer.
Figure 10:
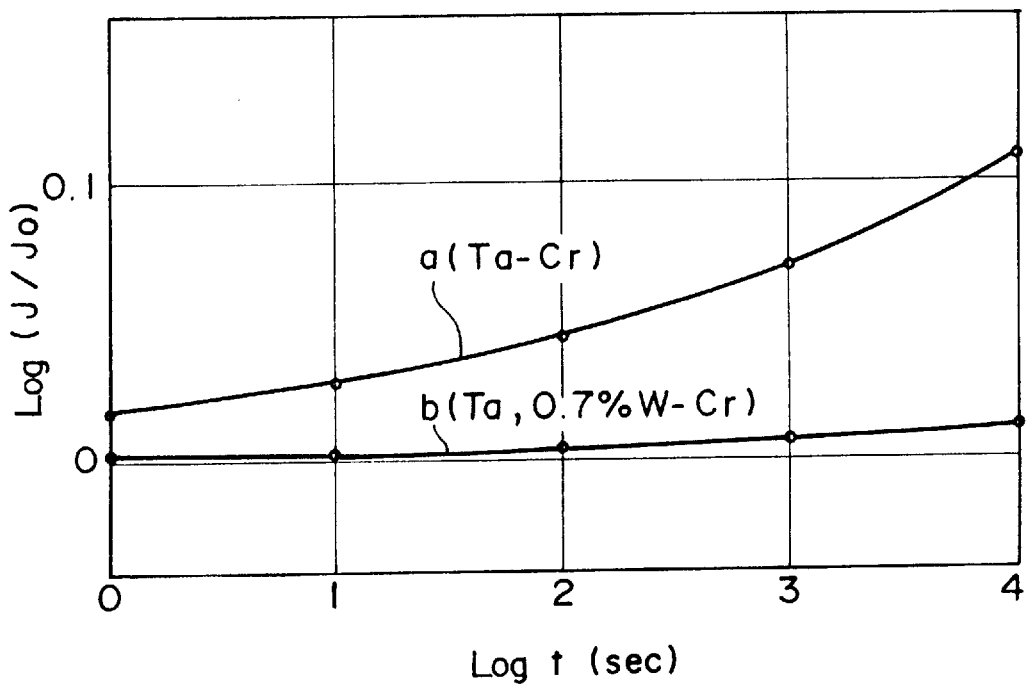
FIG. 10 is a graph of the difference in current density in the MIM element plotted against time, for introducing Equation 3.
Figure 11:
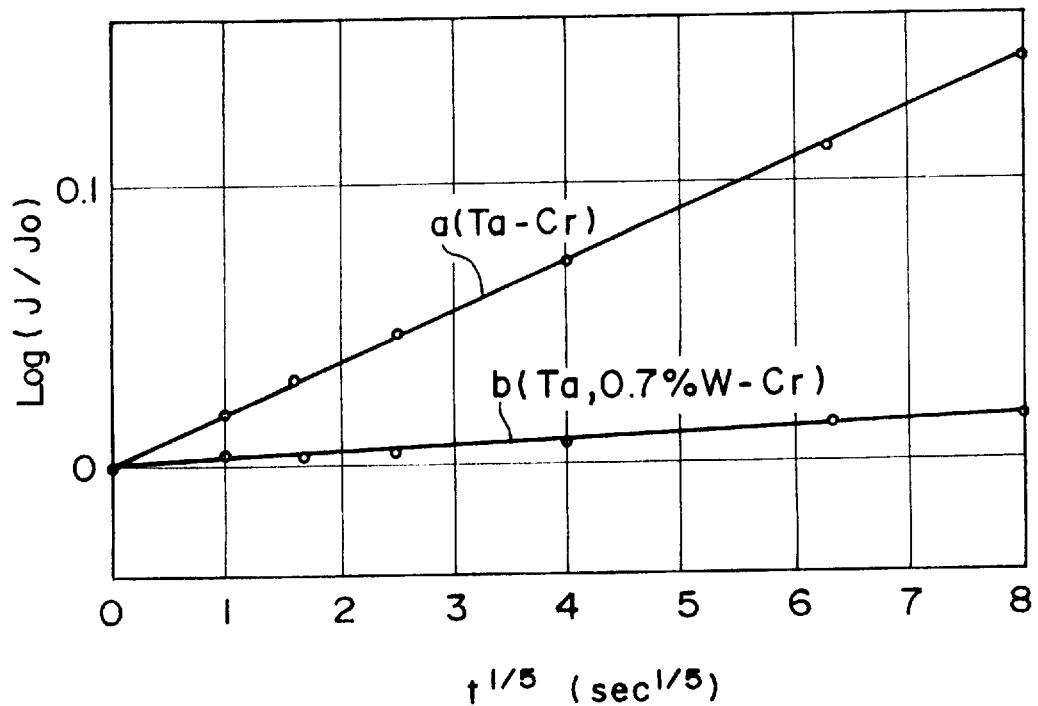
FIG. 11 is a graph of the difference in current density in the MIM element plotted against time ($t^{1/5}$), obtained from the curves of FIG. 10.
Figure 12:
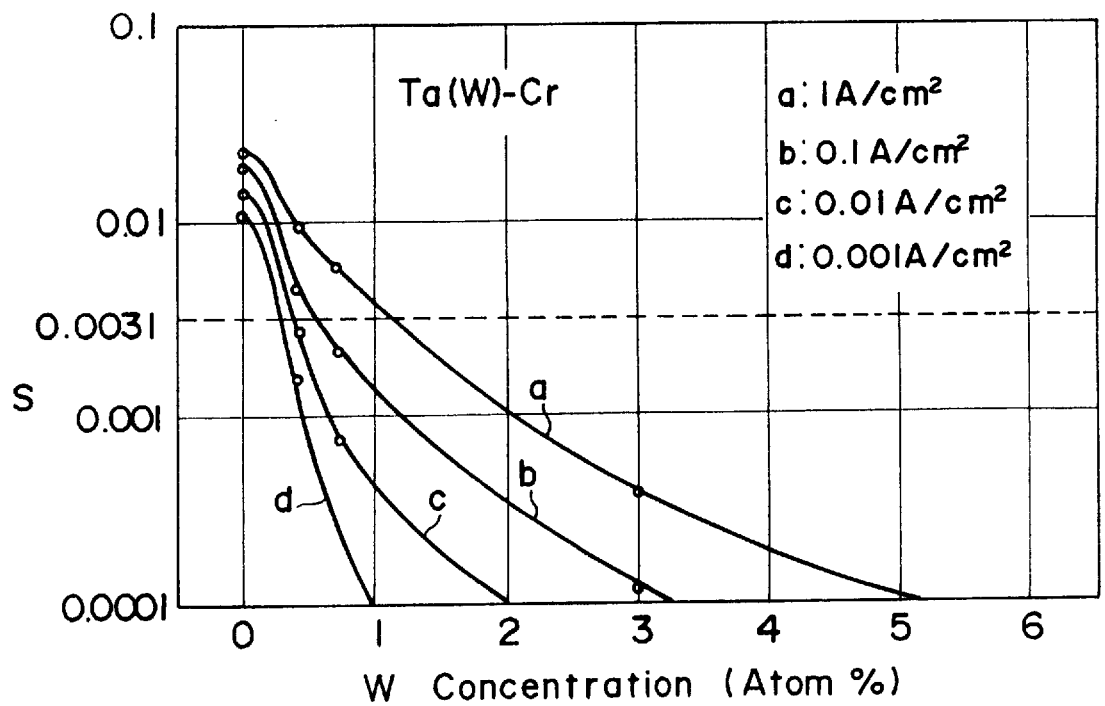
FIG. 12 is a graph of the coefficient S of Equation 3 plotted against the concentration of tungsten added to the tantalum film, when chromium is used as the second conductive layer.
Figure 13:
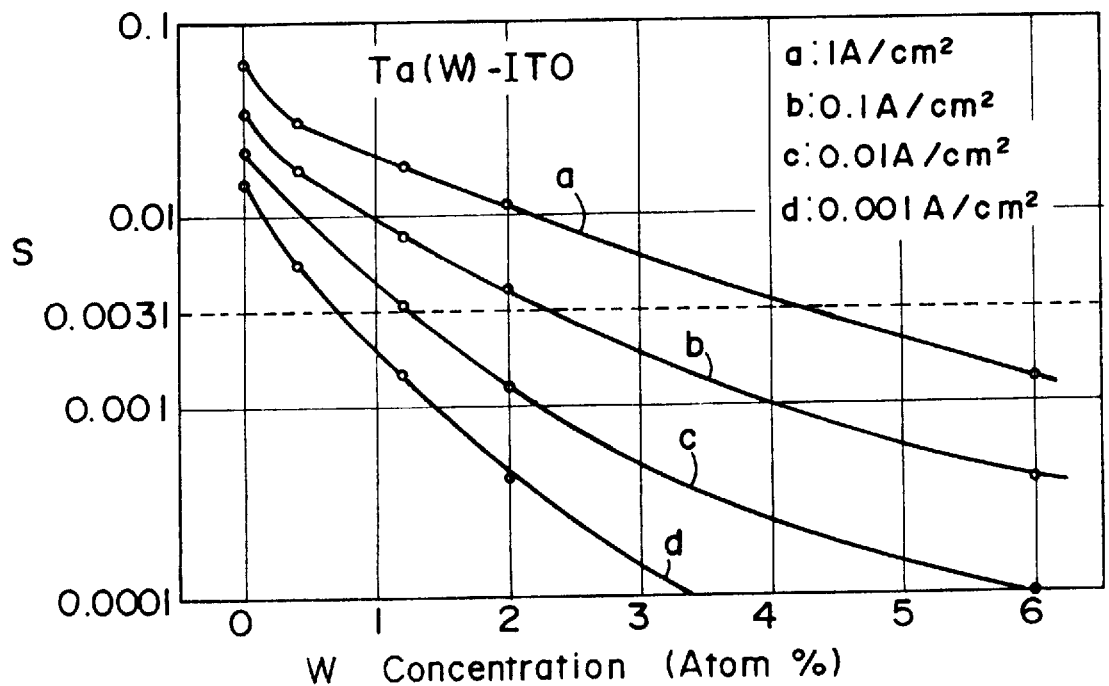
FIG. 13 is a graph of the coefficient S of Equation 3 plotted against the concentration of tungsten added to the tantalum film, when ITO is used as the second conductive layer.
Figure 14:
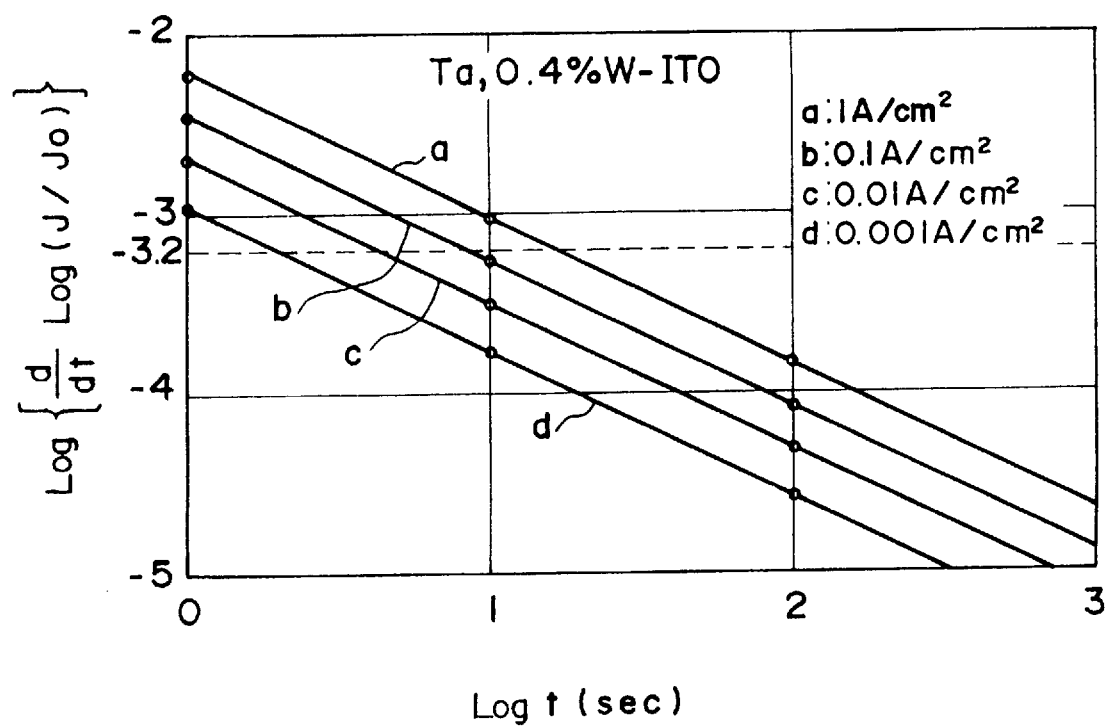
FIG. 14 is a graph of the slope of the difference in current in the MIM element plotted against time, when 0.4 atom % of tungsten is added to the tantalum film.
Figure 15:
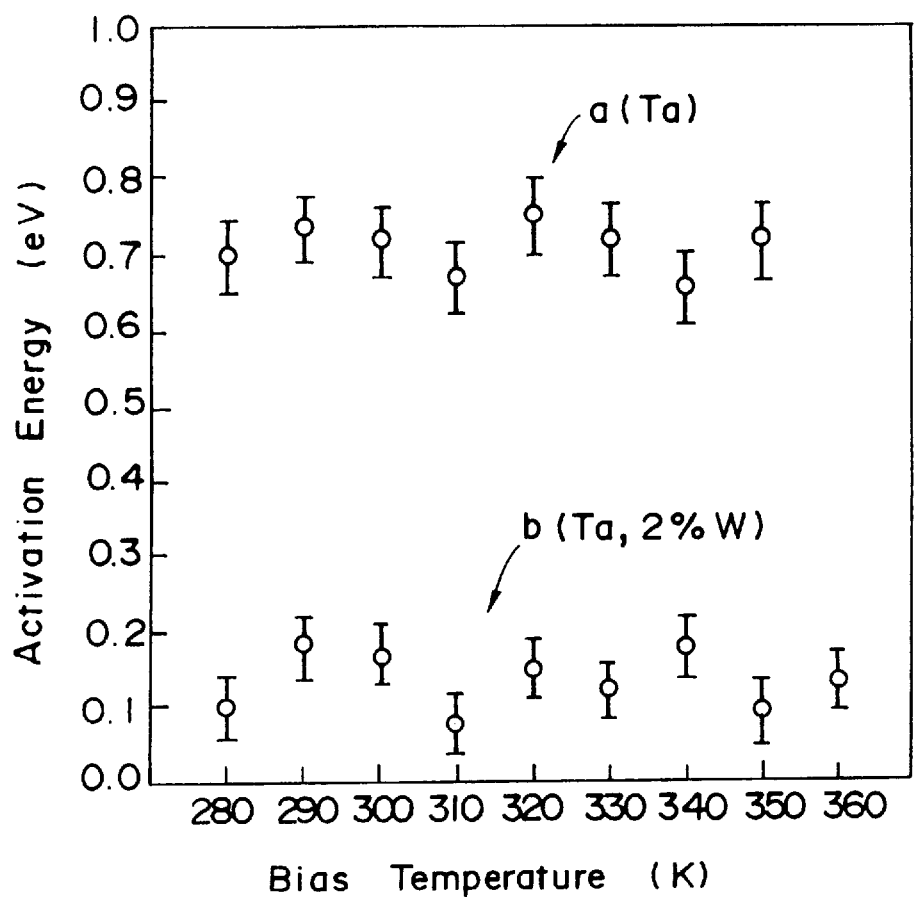
FIG. 15 is a graph of activation energy plotted against bias temperature, obtained by measuring the TSC in the insulating layer.
Figure 16:
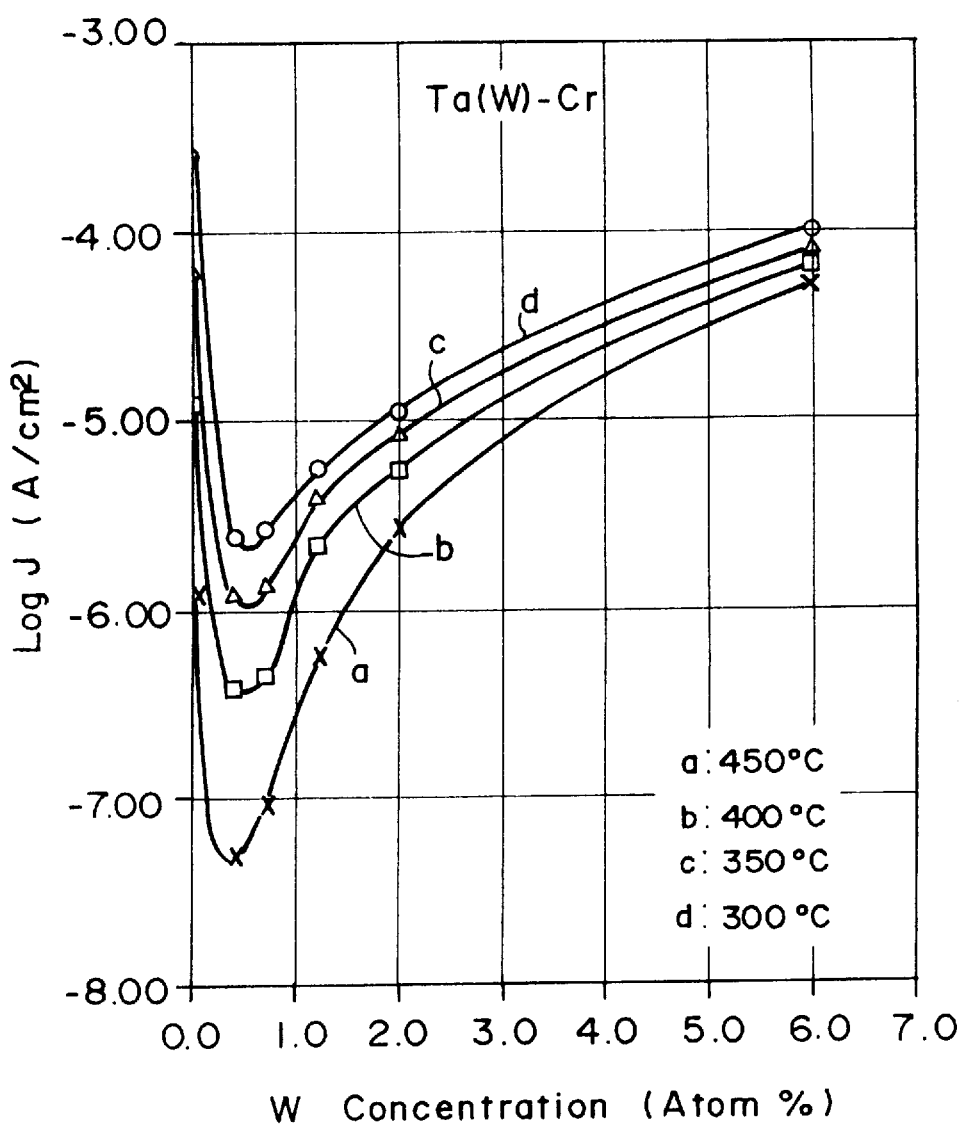
FIG. 16 is a graph of the current density in the MIM element plotted against the concentration of tungsten added to the tantalum film, when the temperature of the first annealing process is varied and chromium is used as the second conductive layer.
Figure 17:
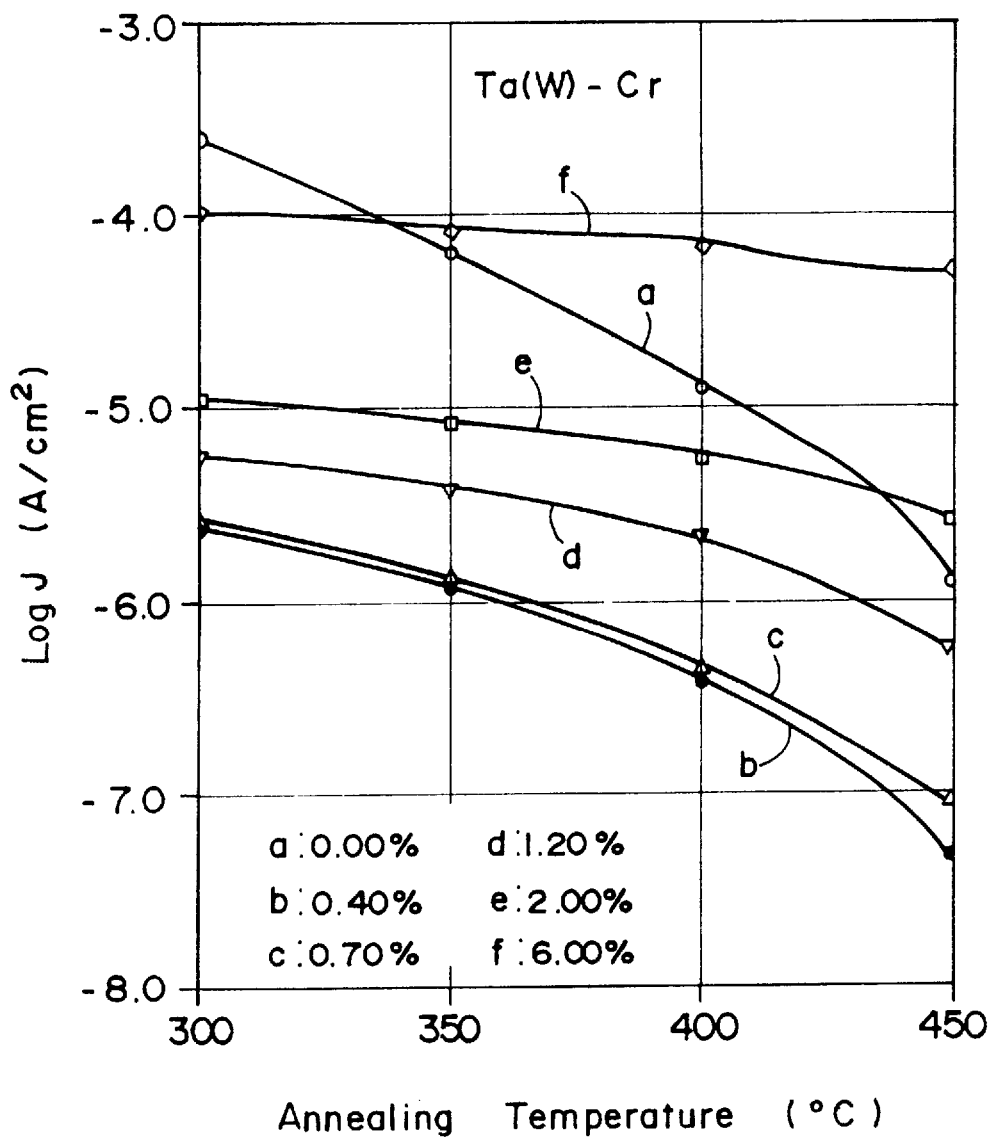
FIG. 17 is a graph of the current density in the MIM element plotted against annealing temperature, obtained from the data of FIG. 16.
Figure 18:
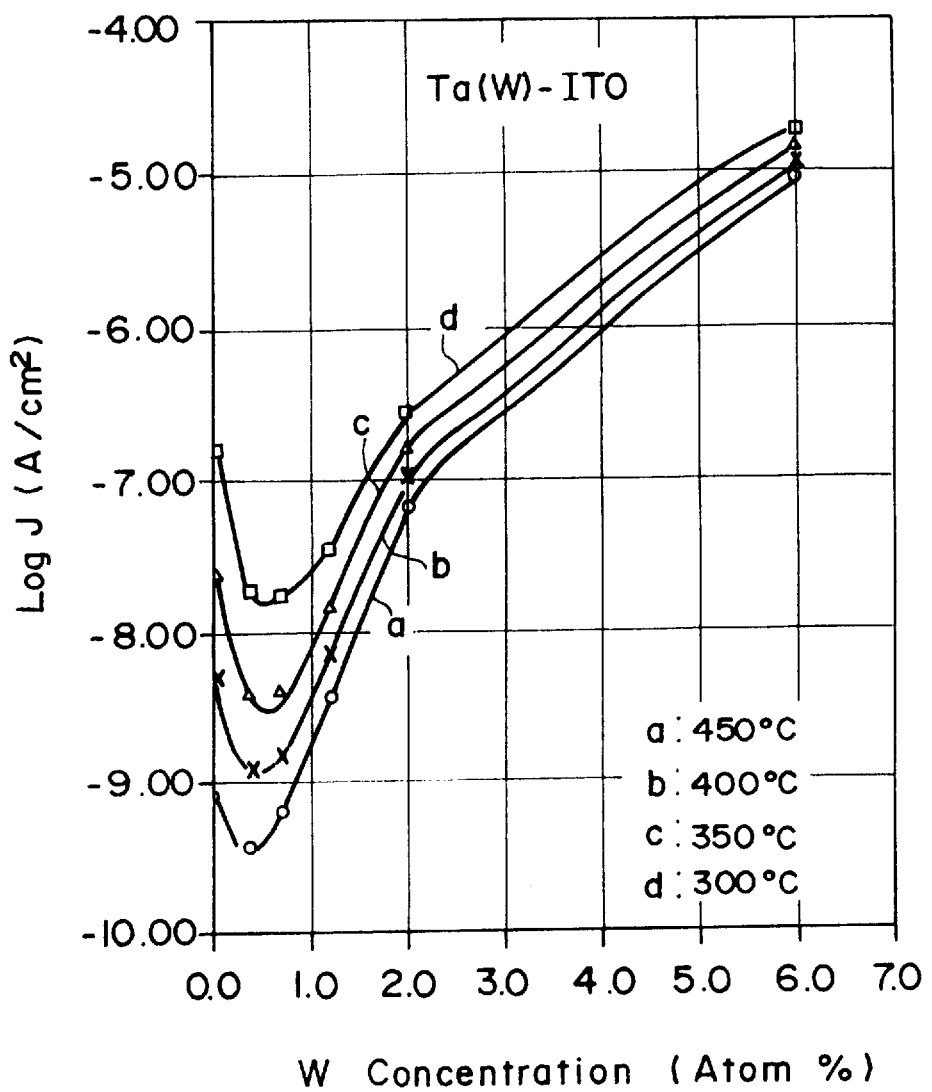
FIG. 18 is a graph of the current density in the MIM element plotted against the concentration of tungsten added to the tantalum film, when ITO is used as the second conductive layer.
Figure 19:
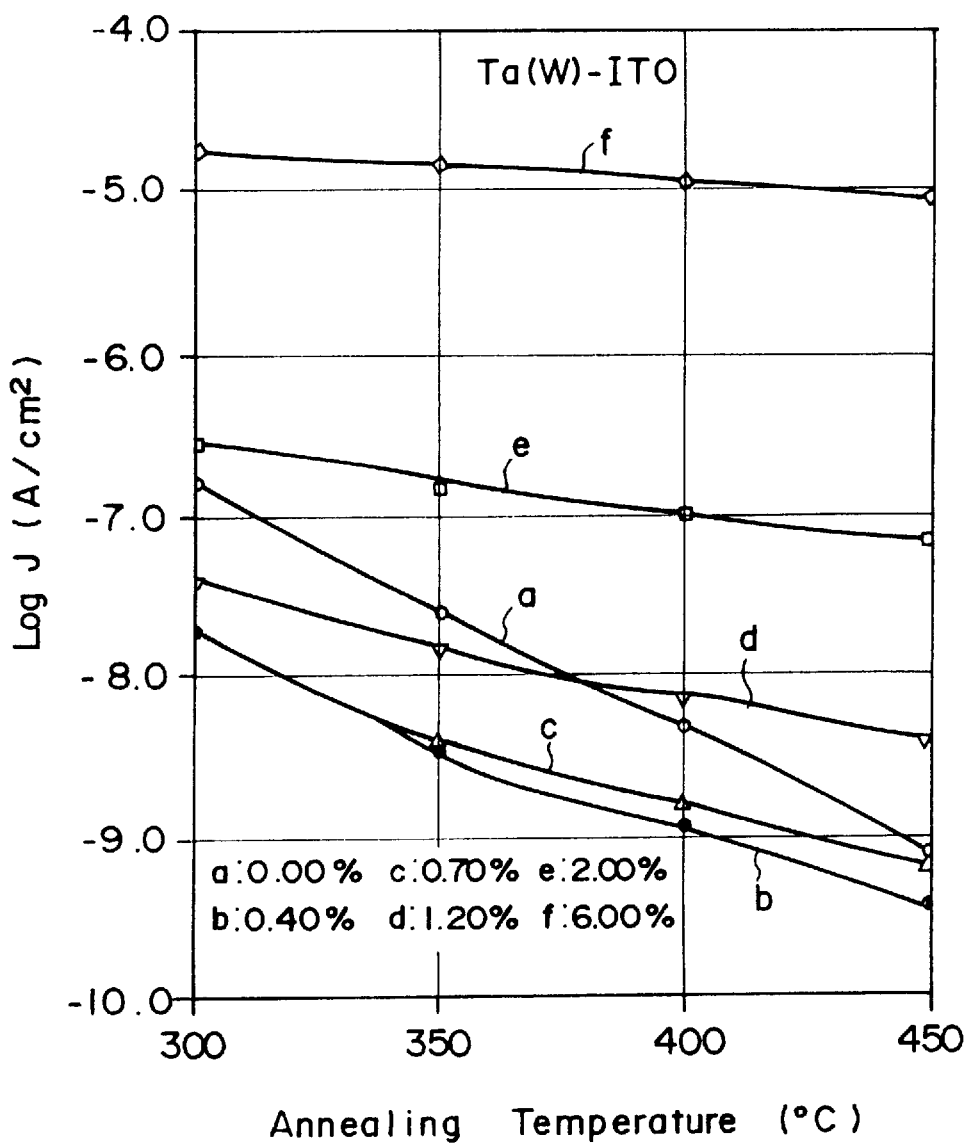
FIG. 19 is a graph of current density in the MIM element plotted against annealing temperature, obtained from the data of FIG. 18.
Figure 20:
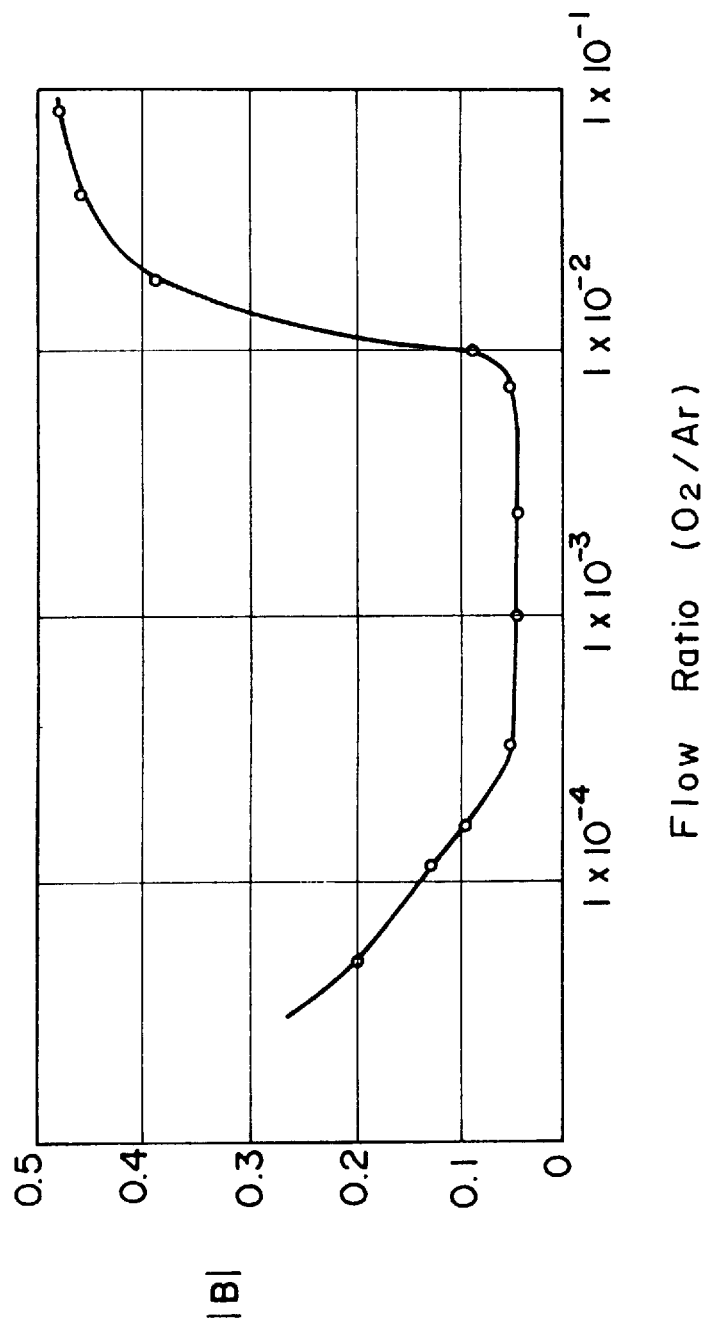
FIG. 20 is a graph of the constant B of Equation 2 plotted against the flow ratio of oxygen and argon, when the second conductive layer is formed of ITO.
Figure 29:
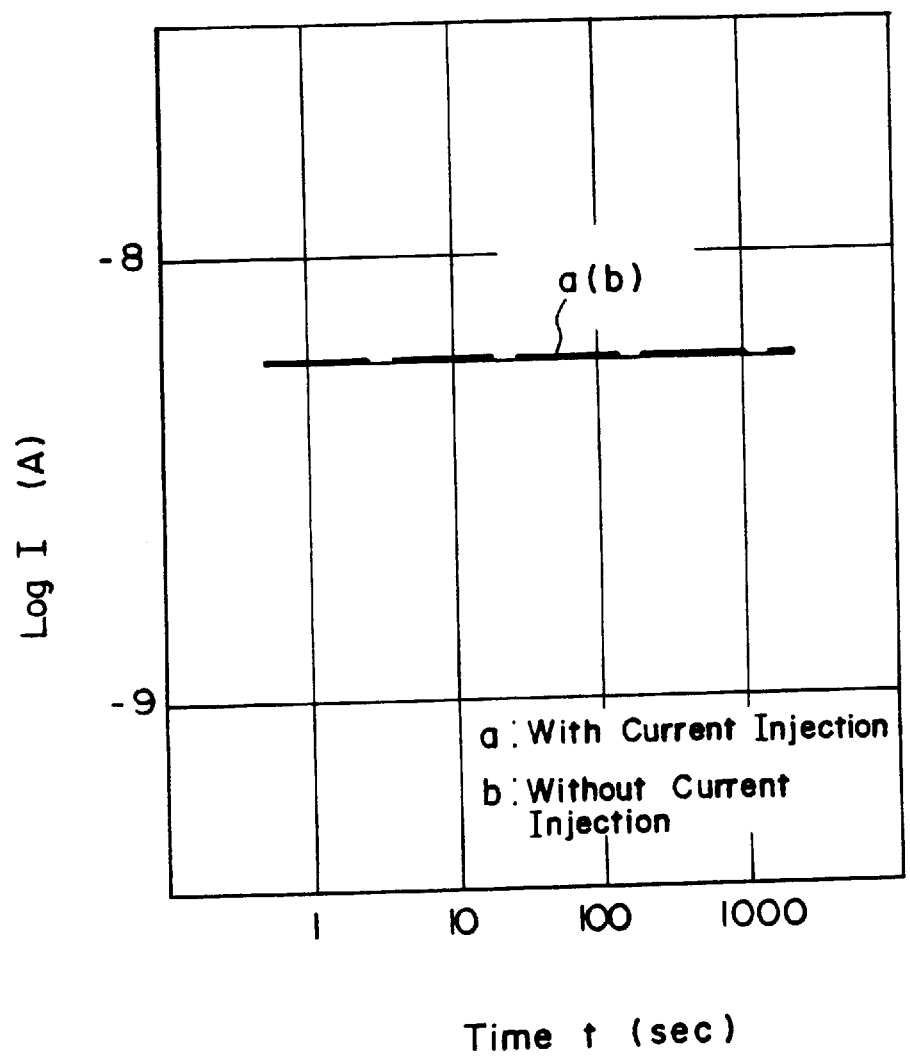
FIG. 29 is a graph of current density in the MIM element plotted against time, during constant-voltage drive when current injection was performed and when current injection was not performed.

A diagram corresponding to FIG. 5, which investigated the relationship between current and time when Equation 2 was applied to an MIM element of this embodiment, is shown in FIG. 29. In FIG. 29, line a shows the change in current with time when a voltage of 10 V is held after current has been injected to the MIM element at approximately 1

A/cm² for 10 seconds, and line b shows the change in current with time when a voltage of 10 V is held after the above described current injection has not been performed. From FIG. 29, it was confirmed that the time-current curves when current injection was performed and when it was not performed were substantially completely identical. Investigation of this experimental results showed that the constant B of Equation 2 is 0.04 and n is −1.64.

Figure 30:
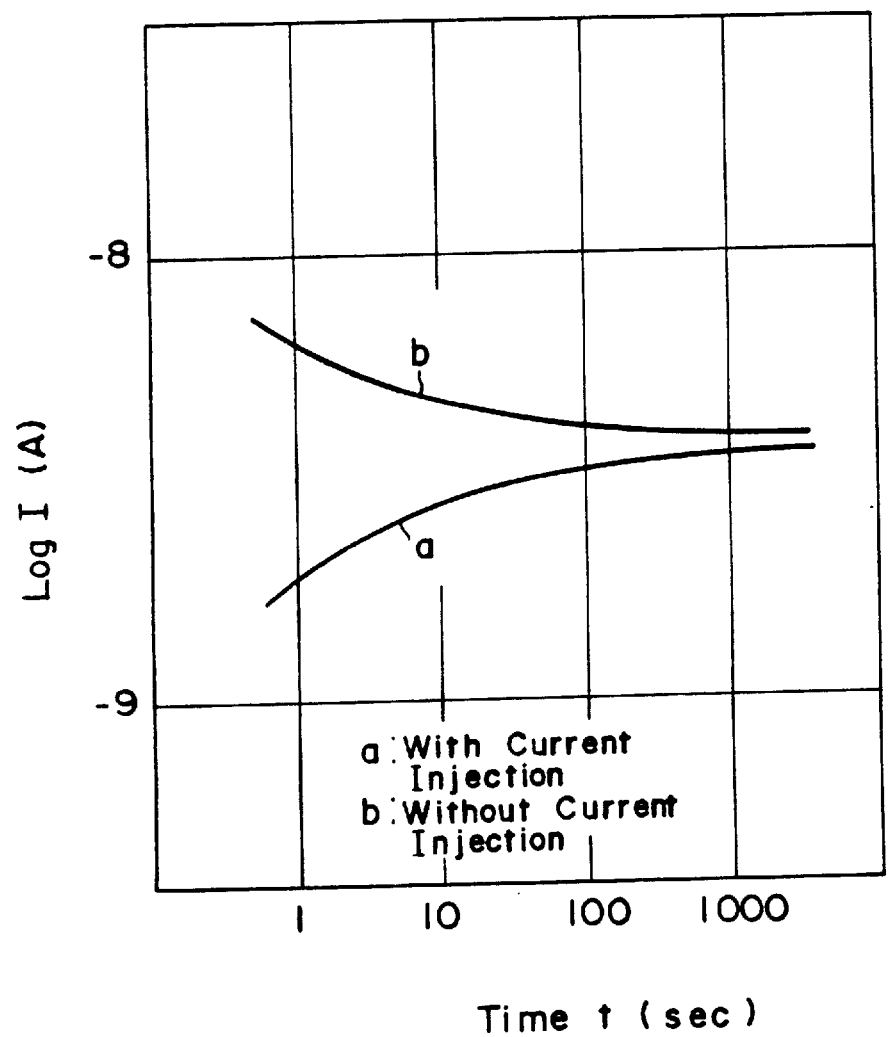
FIG. 30 is a graph of current density in a comparative MIM element plotted against time, during constant-voltage drive when current injection was performed and when current injection was not performed.

For comparison, an MIM element manufactured by the same method as that of this embodiment, except that no tungsten was added to the tantalum film, was measured in the same manner as described above. The results of these measurements are shown in FIG. 30. In FIG. 30, line a shows the results after there was current injection and line b shows the results when there was no current injection. When the constants B and n of Equation 2 were investigated from these time-current characteristics, B was found to be 0.55 and n was −3.25. When the absolute value of the constant B exceeds 0.2 in this manner, the display of a moving image in an active matrix type of liquid crystal display device will result in after-images, or the display will be nonuniform.

(3) Notes on Long-term Changes in Characteristics

When the coefficient S was obtained from Equation 3 for the MIM element of this embodiment, it was found to be $5.01 \times 10^{-4}$. Therefore, the amount of change ($\log (J/J_0)$) in the characteristics of the MIM element of this embodiment stops at approximately $1.63 \times 10^{-2}$, even if the element is driven for 10,000 hours, and thus the sticking image does not occur when this element is used in a liquid crystal display device, even when it is driven for a long time. Use of this MIM element guarantees the display characteristics of a liquid crystal display device; even when it is driven for at least 10,000 hours under conditions of, for example, a duty ratio of 1/200 to 1/2000 and a drive voltage of 10 V to 20 V.

For comparison, when the coefficient S of an MIM element of this embodiment, except that no tungsten was added to the tantalum film was investigated, it was found to be $1.41 \times 10^{-2}$. With this element, 10,000 hours of driving would lead to an amount of change in element characteristic of approximately 0.46, showing that if this element is used in a liquid crystal display device, long-term drive would lead to sticking image.

(4) Notes on Aging

Even with the MIM element of this embodiment of the invention, if the concentration of added tungsten is low (for example, 0.4 atom %), the value of S in Equation 3 cannot be satisfied, and this value is $5.62 \times 10^{-3}$. Therefore, it is necessary to age this element for a time that satisfies Equation 4. In this case, Equation 4 gives:

$\log (5.62 \times 10^{-3}/5) - (4/5) \log t < -3.2$ $\log t > 0.3135$ $t > 2.06$ Thus, at least 2.06 seconds of aging is necessary. Aging the element by just this short length of time ensures that sticking image does not occur in subsequent long-term drive. The characteristics are maintained unchanged after aging, even when the element is left unused, within a practicable temperature range. On the other hand, if the comparative example were to be subjected to aging in the same manner as described above, at least 506.7 (seconds) would be required. Further, sticking image did not occur in this comparative element, at least when it was driven directly after the aging.

(5) Notes on Activation Energy

When the activation energy Ea of the MIM element of this embodiment was obtained from Equation 1, it was found to be 0.42 eV for the OFF voltage. Further, when the activation energy for the thermal stimulation current (TSC) of this MIM element was obtained, it was found to be approximately 0.2 eV.

By having an activation energy from Equation 1 that is no more than 0.534 eV, the temperature dependency of the MIM element can be reduced, so that a liquid crystal display device using this element can maintain stable display characteristics over a wide temperature range such as a practicable temperature range (room temperature to 80° C.). Further, by making the TSC activation energy less than 0.7 eV, the absolute value of the constant B from Equation 2 of the MIM element can be made to be no more than 0.2, so that when this element is used in a liquid crystal display device, a moving display causes no particular problems and after-images can be avoided.

As described above, the MIM element of this embodiment not only has basic characteristics such as a voltage-current characteristic that is nonlinear and symmetric, it can also maintain these characteristics stably in the long term without being affected by heat or current injection. Further, since the second conductive layer of this MIM element is formed of ITO, a pixel electrode can be formed at the same time as the second conductive layer, which can simplify the manufacturing process.

Second Embodiment

The MIM element of this second embodiment has the same basic configuration as that of the first embodiment. The MIM element of this embodiment differs from the first embodiment in that, during its manufacturing process, the electrolyte used in the formation of the insulating layer is not an aqueous solution of citric acid but an aqueous solution of ammonium tungstate. In other words, the electrolyte used in the anodization is 0.001 to 0.05% by weight (in this embodiment: 0.005% by weight) of an aqueous solution of ammonium tungstate. The other conditions of the anodization are the same as in the first embodiment, that is, the anodization is done by a constant-voltage method at 20 to 40 V (in this embodiment: 30 V) for 0.5 to 4 hours (in this embodiment: 2 hours).

Figure 31:
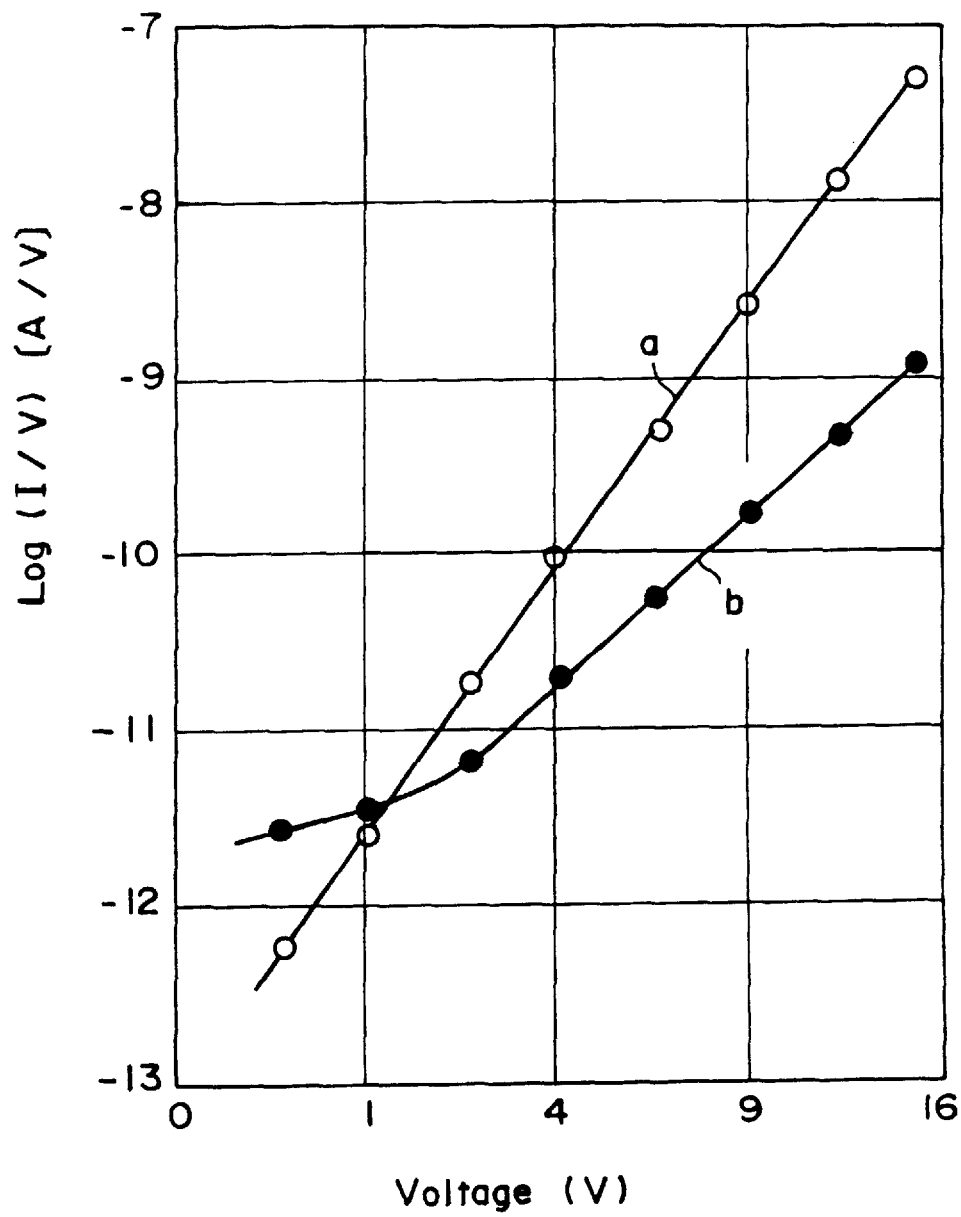
FIG. 31 is a graph illustrating the relationship between voltage and current, when the electrolyte used for anodization in a second embodiment of this embodiment was an aqueous solution of ammonium tungstate.

It was confirmed that the slope of the voltage-current characteristic of the MIM element of this embodiment is steeper than that of the first embodiment. The two voltage-current curves are shown in FIG. 31. In FIG. 31, curve a shows the characteristic of this embodiment and curve b shows that of an MIM element in which citric acid was used as the electrolyte for anodization. From FIG. 31, it was confirmed that if an aqueous solution of ammonium tungstate is used for the anodization, the slope of the voltage-current curve of the resultant element is steeper than one for which an aqueous solution of citric acid is used, and the characteristic of writing to the liquid crystal layer is also better. Further, it has been confirmed that the use of an aqueous solution of phosphoric acid in the anodization provides similar characteristics.

Third Embodiment

Figure 32:
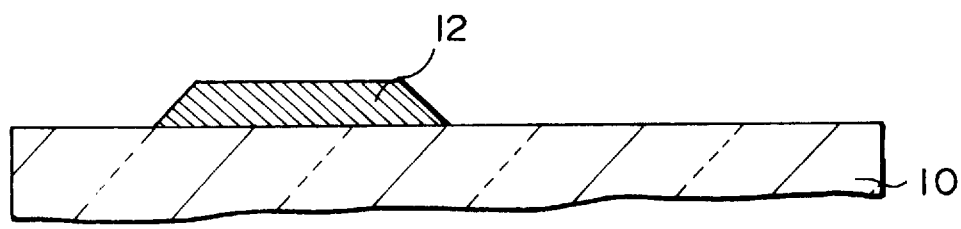
FIG. 32 and FIG. 33 are cross sectional views simply showing the process of manufacturing the element of a third embodiment of this invention.
Figure 33:
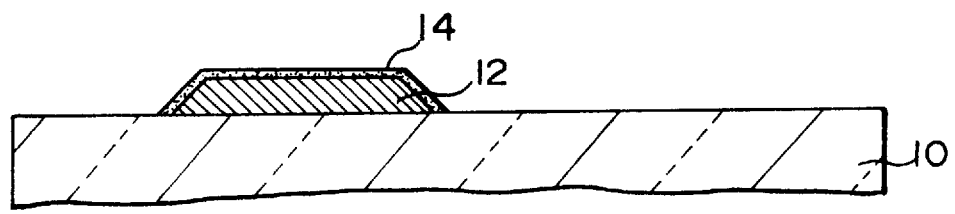
Figure 34:
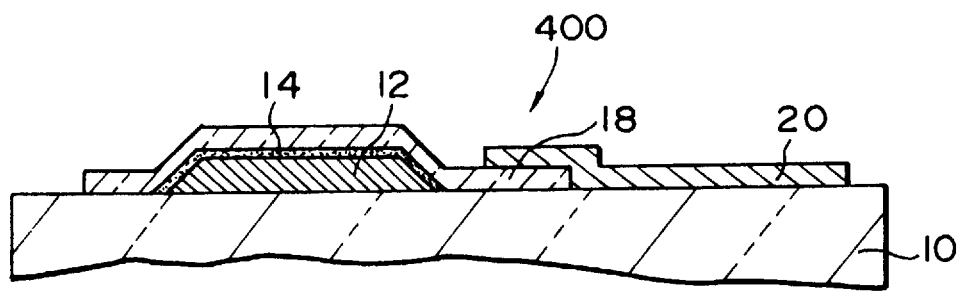
FIG. 34 is a cross sectional view simply showing an MIM element of a third embodiment of this invention (a cross section taken along the line B—B in FIG. 35)
Figure 35:
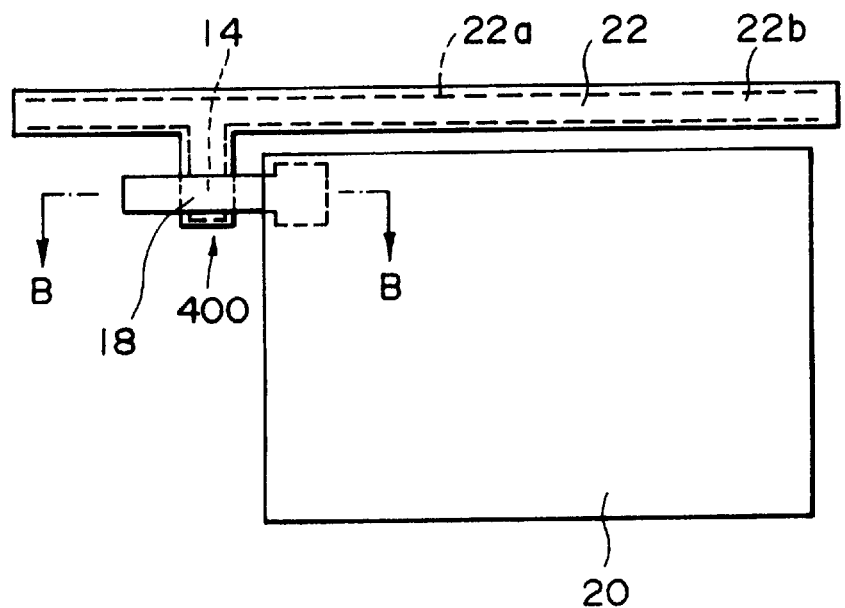
FIG. 35 is a plane view simply showing a unit electrode that forms an electrode substrate using the MIM element shown in FIG. 34.

The MIM element 400 of this third embodiment uses a film of a metal such as chromium, aluminum, titanium, or molybdenum (in this embodiment: a chromium film) in place of the second conductive layer of the MIM element of the first embodiment. The manufacturing method and structure of the first conductive layer 12 and insulating layer 14 of the MIM element 400 (see FIGS. 32 and 33) are the same as those of the first embodiment, so a detailed description thereof is omitted. A second conductive layer 18 is formed of a chrome film by, for example, sputtering to a film thickness of 500 to 3000 angstrom (in this embodiment: 1500 angstrom), then conventional photolithography and etching techniques are used to pattern this layer (see FIG. 34). An ITO film is then deposited by a method such as sputtering to a film thickness of 300 to 2000 angstrom (in this embodiment: 500 angstrom), and photolithography and etching techniques are used to form a predetermined pattern and form a pixel electrode 20 (see FIGS. 34 and 35). In the MIM element 400 obtained in this manner, the second conductive layer 18 and the pixel electrode 20 are connected in a superimposed state.

Good results were obtained for the various characteristics of this MIM element 400, in the same manner as in the first embodiment. That is, with this element, the value of constant B in Equation 2 is 0.001 and that of n is −0.78. Further, it was confirmed that the value of the coefficient S in Equation 3 is $2.24\times10^{-5}$. It was also confirmed that activation energy of Equation 1 for the OFF current is 0.40 eV, and the TSC activation energy is approximately 0.2 eV.

A preferred embodiment of the present invention was described above, but it should be obvious to those skilled in the art that this invention is not limited thereto, and can be modified in various ways within the range of specification of this invention. For example, the same phenomena as those described above would occur in this embodiment if the material added to the first conductive layer were molybdenum, niobium, rhenium, $WO_3$, or the like, instead of tungsten.

Figure 36:
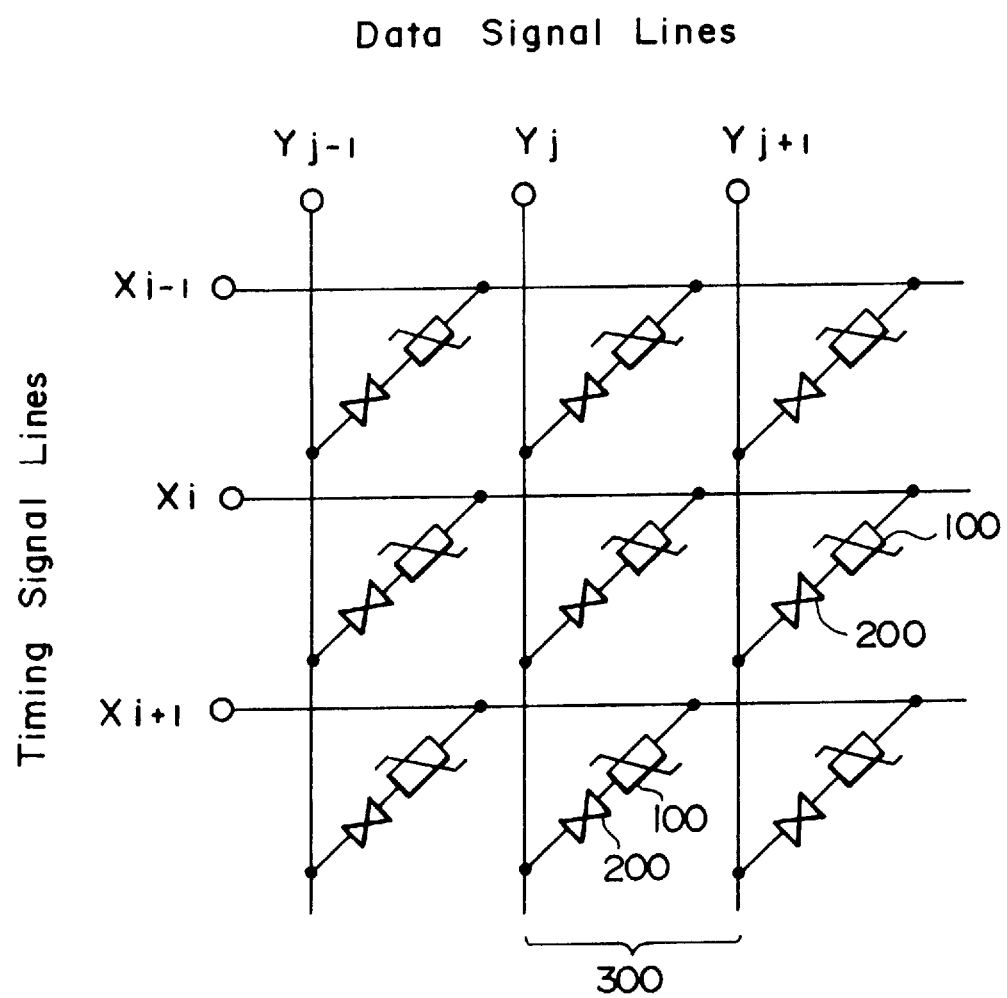
FIG. 36 is a view of an active matrix type of drive circuit using the MIM element of this invention.
Figure 37:
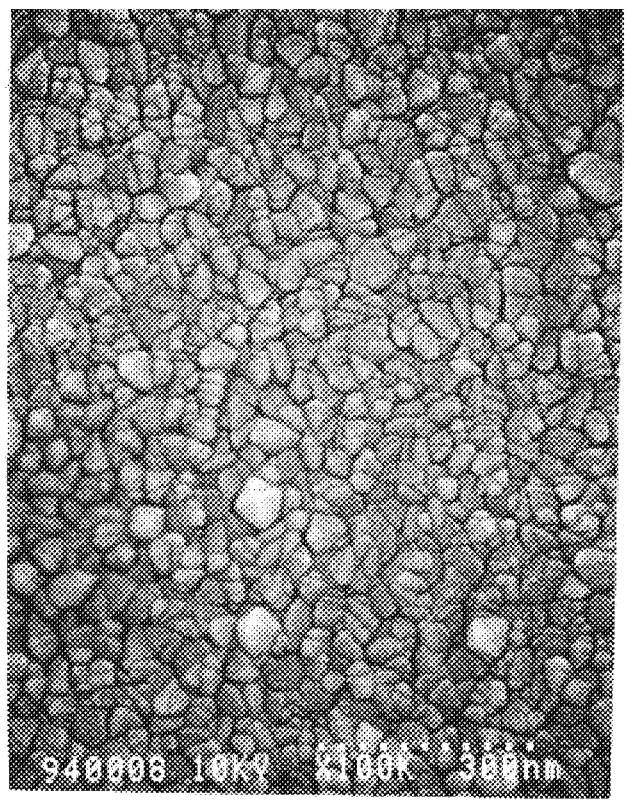
FIGS. 37 to 40 are scanning electron microscope photographs of the surfaces of ITO films obtained by sputtering, when the conditions of the flow ratio of oxygen and argon is varied.
Figure 38:
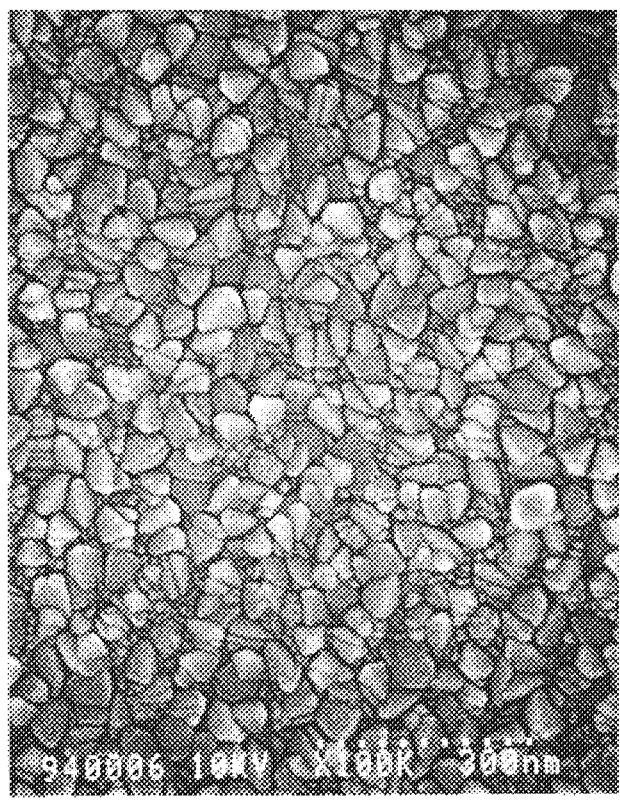
Figure 39:
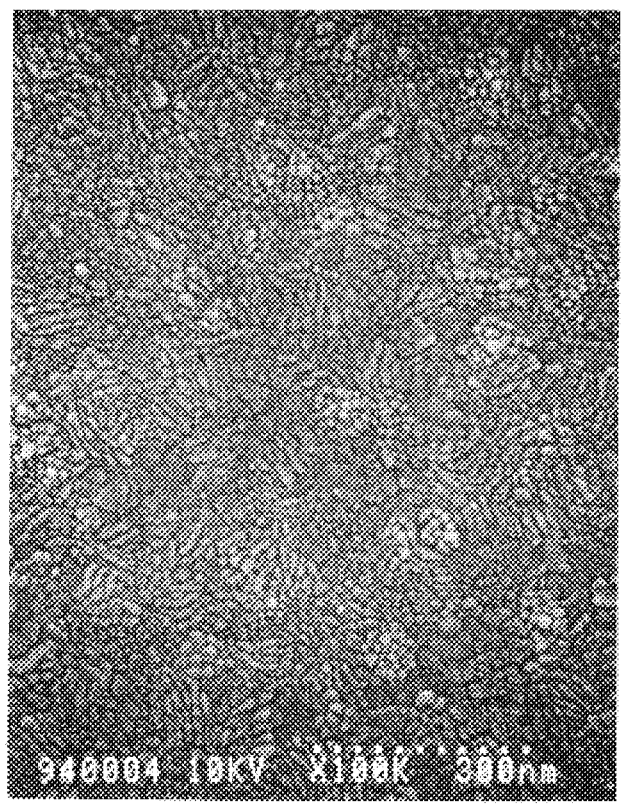
Figure 40:
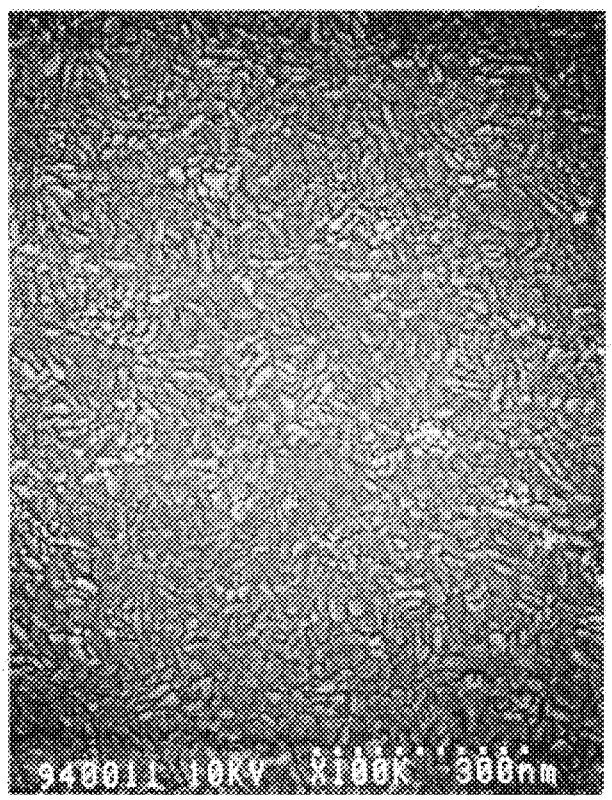
Figure 41:
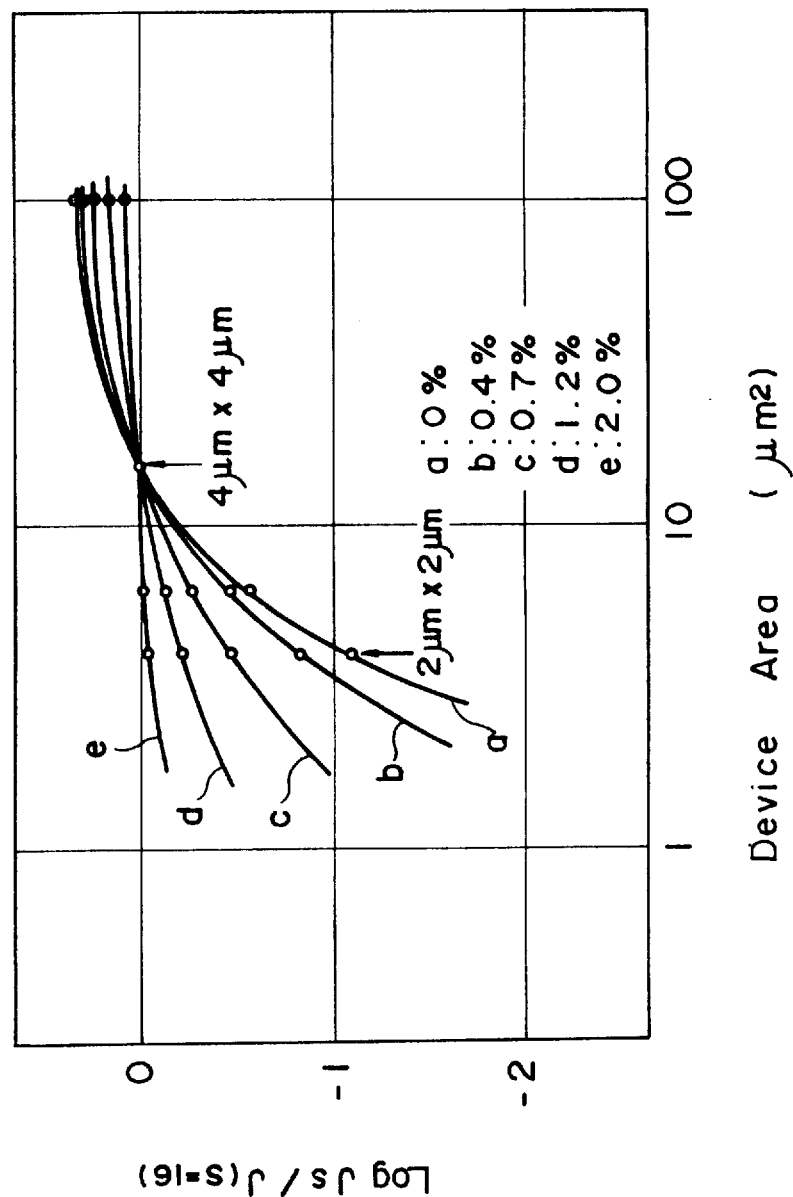
FIG. 41 is a graph of difference in current density while the ON voltage is applied plotted against the element area.

An equivalent circuit of an active matrix type of liquid crystal display device using the MIM type of nonlinear resistance element of this invention is shown in FIG. 36. In this equivalent circuit, an MIM element 100 (400) and a liquid crystal cell 200 are connected in series at each intersection between a timing signal line (scan line) X and a data signal line Y, in a pixel region 300. The display operation is controlled by switching the liquid crystal cell 200 between a display status, a non-display status, and an intermediate status therebetween, on the basis of signals applied to the timing signal line X and data signal line Y.

The MIM type of nonlinear resistance element of this invention is particularly useful in an active matrix type of liquid crystal display device.

The structure of the active matrix type of liquid crystal display device to which the nonlinear resistance element of this invention is applied is not limited in any particular manner, but it comprises at least: a first substrate provided with a transparent substrate, signal electrodes (timing signal lines and data signal lines) arranged in a predetermined pattern on this substrate, nonlinear resistance elements of this invention connected to these signal electrodes at a predetermined pitch, and pixel electrodes connected to the second conductive layers of these nonlinear resistance elements; a second substrate provided with opposing signal electrodes positioned to correspond with the pixel electrodes; a liquid crystal layer sealed between the first substrate and the second substrate; and a display panel to which is connected a component such as a polarizing plate or color filter.

The liquid crystal display device of this invention can be applied to all types of liquid crystal display equipment, and when it is used in a display devices such as a liquid crystal TV or a video games machine, it enables good display capabilities and also ensures that even moving images can be displayed with no after-images. Further, when the liquid crystal display device of this invention is used in a display means such as a personal computer, workstation, or automated office equipment, it enables good display capabilities and also ensures that a fixed pattern can be displayed with no sticking image.

We claim:

1. A nonlinear resistance element comprising a first conductive layer, an insulating layer, and a second conductive layer stacked in sequence on a substrate, wherein:

said first conductive layer is a single-layer metal film whose main component is a metal to which is added a chemical element having a valence 1 or 2 greater than that of said metal, in the concentration of 0.2 to 6 atom %, and said insulating layer is an anodized layer of said first conductive layer.

2. A nonlinear resistance element according to claim 1, wherein:

said metal that is the main component of said first conductive layer is tantalum.

3. A nonlinear resistance element according to claim 1, wherein:

said chemical element added to said first conductive layer is at least one element selected from the group consisting of tungsten, chromium, molybdenum, and rhenium.

4. A nonlinear resistance element according to claim 3, wherein:

said chemical element is tungsten.

5. A nonlinear resistance element according to claim 1, wherein:

said second conductive layer is at least one of a chromium film and a transparent conductive film.

6. A nonlinear resistance element according to claim 1, wherein:

said second conductive layer is formed of chromium, said chemical element added to said first conductive layer is tungsten, and the concentration thereof is 0.3 to 6 atom %.

7. A nonlinear resistance element according to claim 1, wherein:

said second conductive layer is a transparent conductive film, said chemical element added to said first conductive layer is tungsten, and the concentration thereof is 0.3 to 4.5 atom %.

8. A nonlinear resistance element comprising a first conductive layer, an insulating layer, and a second conductive layer stacked in sequence on a substrate, wherein:

said first conductive layer is a single-layer metal film whose main component is a metal to which is added 0.8 to 6 atom % tungsten, said insulating layer is an anodized layer of said first conductive layer, said second conductive layer is at least one of a chromium film and a transparent conductive film, and a current density J of the current flowing through said element can be approximated by Equation 1 below, provided an activation energy Ea in said Equation 1 is no more than 0.534 eV:

$$J = A \exp(-Ea/kT) \qquad \text{Equation 1}$$

where:

A is a constant, k is Boltzmann's constant, and

T is absolute temperature.

9. A nonlinear resistance element according to claim 8, wherein:

said metal of said single-layer metal film is tantalum.

10. A nonlinear resistance element according to claim 8, wherein:

said second conductive layer is formed from chromium.

11. A nonlinear resistance element according to claim 8, wherein:

said second conductive layer is a transparent conductive film, and from 1.2 to 6 atom % tungsten is added to said first conductive layer.

12. A nonlinear resistance element comprising a first conductive layer, an insulating layer, and a second conductive layer stacked in sequence on a substrate, wherein:

said first conductive layer is a single-layer metal film whose main component is a metal to which is added 0.2 to 6 atom % tungsten, said insulating layer is an anodized layer of said first conductive layer, said second conductive layer is at least one of a chromium film and a transparent conductive film, and if a current density in the element is $J_2$ when a bias voltage of 10 V is applied after a current is injected for 10 seconds at a current density of 1 A/cm$^2$, and $J_1$, when a bias voltage of 10 V is applied after no current is injected, the following Equation 2 is approximately satisfied, where the constants B and n in said Equation 2 satisfy the relationships $|B| \leq 0.2$ and n<0:

$$\log (J_2/J_1) = B \times t^{1/n} \qquad \text{Equation 2}$$

where t is the elapsed time in seconds since the bias voltage was applied.

13. A nonlinear resistance element according to claim 12, wherein:

said metal of said single-layer metal film is tantelum.

14. A nonlinear resistance element according to claim 13, wherein:

said second conductive layer is formed from chromium.

15. A nonlinear resistance element according to claim 13, wherein:

said second conductive layer is a transparent conductive film, and a concentration of tungsten added to said first conductive layer is 0.3 to 6 atom %.

16. A nonlinear resistance element comprising a first conductive layer, an insulating layer, and a second conductive layer stacked in sequence on a substrate, wherein:

said first conductive layer is a single-layer metal film whose main component is a metal to which is added 0.3 to 6 atom % tungsten, said insulating layer is an anodized layer of said first conductive layer, said second conductive layer is at least one of a chromium film and a transparent conductive film, and the following Equation 3 is approximately satisfied when a voltage within a predetermined range is applied to said element, provided the coefficient S in said Equation 3 is no more than 3×10$^{-3}$:

$$\log (J/J_0) = S \times t^{1/m} \qquad \text{Equation 3}$$

where:

t is the elapsed time in seconds since the drive was started,

J is the current density (A/cm$^2$) at elapsed time t,

Jo is the current density (A/cm$^2$) when the elapsed time t is 1 second, and $m \geq 1$.

17. A nonlinear resistance element according to claim 16, wherein:

the value of m in said Equation 3 is 5.

18. A nonlinear resistance element according to claim 16, wherein:

said metal of said single-layer metal film is tantalum.

19. A nonlinear resistance element according to claim 18, wherein:

said second conductive layer is formed from chromium.

20. A nonlinear resistance element according to claim 18, wherein:

said second conductive layer is a transparent conductive film, and a concentration of tungsten added to said first conductive layer is 0.7 to 6 atom %.

21. A nonlinear resistance element comprising a first conductive layer, an insulating layer, and a second conductive layer stacked in sequence on a substrate, wherein:

said first conductive layer is a single-layer metal film whose main component is a metal, to which is added 0.2 to 6 atom % tungsten, said insulating layer is an anodized layer of said first conductive layer, said second conductive layer is at least one of a chromium film and a transparent conductive film, and the following Equation 3 is approximately satisfied when a voltage within a predetermined range is applied to said element:

$$\log (J/J_0) = S \times t^{1/m} \qquad \text{Equation 3}$$

where:

t is the elapsed time (in seconds) since the drive was started,

J is the current density (A/cm$^2$) at elapsed time t, and $J_0$ is the current density (A/cm$^2$) when the elapsed time t is 1 second;

said Equation 3 being approximately satisfied when said predetermined voltage is applied to said element, the value of m in said Equation 3 is 5, and the value of coefficient S exceeds 3.1×10$^{-3}$, aging for at least a time t being performed such that the following Equation 4 is satisfied:

$$\log (S/5) - (4/5) \log t < -3.2 \qquad \text{Equation 4.}$$

22. A nonlinear resistance element according to claim 21, wherein:

said metal of said single-layer metal film is tantalum.

23. A nonlinear resistance element comprising a first conductive layer, an insulating layer, and a second conductive layer stacked in sequence on a substrate, wherein:

said first conductive layer is a single-layer metal film whose main component is a metal to which is added 0.2 to 6 atom % tungsten, said insulating layer is an anodized layer of said first conductive layer, said second conductive layer is at least one of a chromium film and a transparent conductive film, and an activation energy of a thermal stimulation current TSC in said insulating layer is less than 0.7 eV.

24. A nonlinear resistance element according to claim 23, wherein:

said metal of said single-layer metal film is tantalum.

25. A nonlinear resistance element according to claim 23, wherein:

said activation energy is 0.3 eV or less.

26. A nonlinear resistance element according to claim 24, wherein:

said second conductive layer is formed from chromium.

27. A nonlinear resistance element according to claim 24, wherein:

said second conductive layer is a transparent conductive film.

28. A nonlinear resistance element comprising a first conductive layer, an insulating layer, and a second conductive layer stacked in sequence on a substrate, wherein:

said first conductive layer is a single-layer metal film whose main component is a metal to which is added 0.2 to 6 atom % tungsten, said insulating layer is an anodized layer of said first conductive layer, said second conductive layer is a transparent conductive film, and said transparent conductive film has a granular crystal structure, said structure comprising one or more crystals, wherein the ratio of long axis to short axis of the surface form of said crystals of the crystal structure is 3 to 1.

29. A nonlinear resistance element according to claim 28, wherein:

said metal of said single-layer metal film is tantalum.

30. A liquid crystal display device comprising:

a first substrate provided with signal electrodes arranged in a predetermined pattern on said first substrate, nonlinear resistance elements connected to said signal electrodes, and pixel electrodes;

a second substrate provided with opposing signal electrodes positioned to correspond with said pixel electrodes; and a liquid crystal layer located between said first substrate and said second substrate, wherein:

said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:

said first conductive layer is a single-layer metal film whose main component is a metal to which is added a chemical element having a valence 1 or 2 greater than that of said metal, in a concentration of 0.2 to 6 atom %, and said insulating layer is an anodized layer of said first conductive layer.

31. A liquid crystal display device comprising:

a first substrate provided with signal electrodes arranged in a predetermined pattern on said first substrate, nonlinear resistance elements connected to said signal electrodes, and pixel electrodes;

a second substrate provided with opposing signal electrodes positioned to correspond with said pixel electrodes; and a liquid crystal layer located between said first substrate and said second substrate, wherein:

said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:

said first conductive layer is a single-layer metal film whose main component is a metal to which is added a chemical element having a valence 1 or 2 greater than that of said metal, in a concentration of 0.2 to 6 atom %, said insulating layer is an anodized layer of said first conductive layer, said second conductive layer is at least one of a chromium film and a transparent conductive film, and a current density J of the current flowing through said element can be approximated by Equation 1 below, provided an activation energy Ea in said Equation 1 is no more than 0.534 eV:

$$J = A \exp(-Ea/kT) \qquad \text{Equation 1}$$

where:

A is a constant, k is Boltzmann's constant, and

T is absolute temperature.

32. A liquid crystal display device comprising:

a first substrate provided with signal electrodes arranged in a predetermined pattern on said first substrate, nonlinear resistance elements connected to said signal electrodes, and pixel electrodes;

a second substrate provided with opposing signal electrodes positioned to correspond with said pixel electrodes; and a liquid crystal layer located between said first substrate and said second substrate, wherein:

said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:

said first conductive layer is a single-layer metal film whose main component is a metal to which is added a chemical element having a valence 1 or 2 greater than that of said metal, in a concentration of 0.2 to 6 atom %, said insulating layer is an anodized layer of said first conductive layer, said second conductive layer is at least one of a chromium film and a transparent conductive film, and if a current density in the element is $J_2$ when a bias voltage of 10 V is applied after a current is injected for 10 seconds at a current density of 1 A/cm$^2$, and $J_1$ when a bias voltage of 10 V is applied after no current is injected, the following Equation 2 is approximately satisfied, where the constants B and n in said Equation 2 satisfy the relationships $|B| \leq 0.2$ and $n < 0$:

$$\log (J_2/J_1) = B \times t^{1/n} \qquad \text{Equation 2}$$

where t is the elapsed time (in seconds) since the bias voltage was applied.

33. A liquid crystal display device comprising:
a first substrate provided with signal electrodes arranged in a predetermined pattern on said first substrate, nonlinear resistance elements connected to said signal electrodes, and pixel electrodes;
a second substrate provided with opposing signal electrodes positioned to correspond with said pixel electrodes; and
a liquid crystal layer located between said first substrate and said second substrate, wherein:
said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:
said first conductive layer is a single-layer metal film whose main component is a metal to which is added a chemical element having a valence 1 or 2 greater than that of said metal, in concentration of 0.2 to 6 atom %,
said insulating layer is an anodized layer of said first conductive layer,
said second conductive layer is at least one of a chromium film and a transparent conductive film, and
the following Equation 3 is approximately satisfied when a voltage within a predetermined range is applied to said element, provided the coefficient S in said Equation 3 is no more than $3.1 \times 10^{-3}$:

$$\log (J/J_0) = S \times t^{1/m} \qquad \text{Equation 3}$$

where:
t is the elapsed time (in seconds) since the drive was started,
J is the current density (A/cm$^2$) at elapsed time t,
$J_0$ is the current density (A/cm$^2$) when the elapsed time t is 1 second, and
$m \geq 1$.

34. A liquid crystal display device comprising:
a first substrate provided with signal electrodes arranged in a predetermined pattern on said first substrate, nonlinear resistance elements connected to said signal electrodes, and pixel electrodes;
a second substrate provided with opposing signal electrodes positioned to correspond with said pixel electrodes; and
a liquid crystal layer located between said first substrate and said second substrate, wherein:
said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:
said first conductive layer is a single-layer metal film whose main component is a metal to which is added a chemical element having a valence 1 or 2 greater than that of said metal, in a concentration of 0.2 to 6 atom %,
said insulating layer is an anodized layer of said first conductive layer,
said second conductive layer is at least one of a chromium film and a transparent conductive film, and
the following Equation 3 is approximately satisfied when a voltage within a predetermined range is applied to said element:

$$\log (J/J_0) = S \times t^{1/m} \qquad \text{Equation 3}$$

where:
t is the elapsed time (in seconds) since the drive was started,
J is the current density (A/cm$^2$) at elapsed time t, and
$J_0$ is the current density (A/cm$^2$) when the elapsed time t is 1 second;
said Equation 3 being approximately satisfied when said predetermined voltage is applied to said element, the value of m in said Equation 3 is 5, and the value of coefficient S exceeds $3.1 \times 10^{-3}$,
aging for at least a time t being performed such that the following Equation 4 is satisfied:

$$\log (S/5) - (4/5) \log t < -3.2 \qquad \text{Equation 4.}$$

35. A liquid crystal display device comprising:
a first substrate provided with signal electrodes arranged in a predetermined pattern on said first substrate, nonlinear resistance elements connected to said signal electrodes, and pixel electrodes;
a second substrate provided with opposing signal electrodes positioned to correspond with said pixel electrodes; and
a liquid crystal layer located between said first substrate and said second substrate, wherein:
said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:
said first conductive layer is a single-layer metal film whose main component is a metal to which is added a chemical element having a valence 1 or 2 greater than that of said metal, in a concentration of 0.2 to 6 atom %,
said insulating layer is an anodized layer of said first conductive layer,
said second conductive layer is at least one of a chromium film and a transparent conductive film, and
an activation energy of a thermal stimulation current TSC in said insulating layer is less than 0.7 eV.

36. A liquid crystal display device comprising:
a first substrate provided with signal electrodes arranged in a predetermined pattern on said first substrate, nonlinear resistance elements connected to said signal electrodes, and pixel electrodes;
a second substrate provided with opposing signal electrodes positioned to correspond with said pixel electrodes; and
a liquid crystal layer located between said first substrate and said second substrate, wherein:
said nonlinear resistance elements comprise a first conductive layer, an insulating layer, and a second conductive layer stacked in sequence on said first substrate, each of said pixel electrodes being connected to each of said second conductive layers of said nonlinear resistance elements, wherein:

said first conductive layer is a single-layer metal film whose main component is a metal to which is added a chemical element having a valence 1 or 2 greater that that of said metal, in a concentration of 0.2 to 6 atom %, said insulating layer is an anodized layer of said first conductive layer, said second conductive layer is a transparent conductive film, and said transparent conductive film has a granular crystal structure, said structure comprising one or more crystals, wherein the ratio of long axis to short axis of the surface form of said crystals of the crystal structure is 3 to 1.

37. A nonlinear resistance element according to claim 4, wherein said chemical element is tungsten in a form of $WO_3$.

* * * * *